US012696456B2

(12) United States Patent
Chen et al.

(10) Patent No.: US 12,696,456 B2
(45) Date of Patent: Jul. 28, 2026

(54) FERROELECTRIC-BASED MEMORY DEVICE AND METHOD OF FORMING THE SAME

(71) Applicant: Taiwan Semiconductor Manufacturing Company, Ltd., Hsin-Chu (TW)

(72) Inventors: Yi-Hsuan Chen, Taoyuan City (TW); Kuen-Yi Chen, Hsinchu City (TW); Yi Ching Ong, Hsinchu (TW); Yu-Wei Ting, Taipei City (TW); Kuo-Chi Tu, Hsin-Chu (TW); Kuo-Ching Huang, Hsinchu City (TW); Harry-Hak-Lay Chuang, Zhubei city (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 542 days.

(21) Appl. No.: 18/181,229

(22) Filed: Mar. 9, 2023

(65) Prior Publication Data

US 2023/0389324 A1 Nov. 30, 2023

Related U.S. Application Data

(60) Provisional application No. 63/382,243, filed on Nov. 3, 2022, provisional application No. 63/346,084, filed on May 26, 2022.

(51) Int. Cl.
*H10B 51/20* (2023.01)
*H10D 30/01* (2025.01)
(Continued)

(52) U.S. Cl.
CPC ......... *H10B 51/20* (2023.02); *H10D 30/0415* (2025.01); *H10D 30/701* (2025.01);
(Continued)

(58) Field of Classification Search
None
See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |

(Continued)

FOREIGN PATENT DOCUMENTS

| | | |
|---|---|---|
| TW | 201739028 A | 11/2017 |
| TW | 202030869 A | 8/2020 |

OTHER PUBLICATIONS

U.S. Appl. No. 17/199,626, filed Mar. 12, 2021 by inventors Yu-Feng Yin, Tai-Yen Peng, An-Shen Chang, Han-Ting Tsai, Qiang Fu, Chung-Te Lin for "Low-Resistance Contact to Top Electrodes for Memory Cells and Methods for Forming the Same," 53 pages of text, 25 pages of drawings.

(Continued)

*Primary Examiner* — Xiaoming Liu
(74) *Attorney, Agent, or Firm* — HAYNES AND BOONE, LLP

(57) ABSTRACT

A method of forming a memory device according to the present disclosure includes forming a trench in a first substrate of a first wafer, depositing a data-storage element in the trench, performing a thermal treatment to the first wafer to improve a crystallization in the data-storage element, forming a first redistribution layer over the first substrate, forming a transistor in a second substrate of a second wafer, forming a second redistribution layer over the second substrate, and bonding the first wafer with the second wafer after the performing of the thermal treatment. The data-storage element is electrically coupled to the transistor through the first and second redistribution layers.

20 Claims, 25 Drawing Sheets

(51) Int. Cl.

| | |
|---|---|
| *H10D 30/69* | (2025.01) |
| *H10D 64/01* | (2025.01) |
| *H10D 64/68* | (2025.01) |
| *H10W 20/41* | (2026.01) |
| *H10W 20/42* | (2026.01) |

(52) U.S. Cl.
CPC ......... *H10D 64/033* (2025.01); *H10D 64/689* (2025.01); *H10W 20/42* (2026.01); *H10W 20/435* (2026.01)

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 10,522,749 | B2 | 12/2019 | Shen et al. |
| 2002/0155659 | A1* | 10/2002 | Chen ..................... H10D 1/042<br>257/295 |
| 2004/0173837 | A1* | 9/2004 | Agarwal ................. H10D 1/696<br>257/306 |
| 2012/0003808 | A1 | 1/2012 | Lee |
| 2019/0131383 | A1* | 5/2019 | Frank ................. H10N 70/8833 |
| 2019/0206933 | A1* | 7/2019 | Kim ........................ H10B 61/22 |
| 2020/0273867 | A1* | 8/2020 | Manipatruni ...... G11C 14/0027 |
| 2020/0286687 | A1* | 9/2020 | Lin ......................... H10D 1/684 |
| 2021/0057639 | A1 | 2/2021 | Ku et al. |
| 2021/0098685 | A1 | 4/2021 | Liou et al. |
| 2021/0098695 | A1 | 4/2021 | Peng et al. |
| 2021/0358925 | A1* | 11/2021 | Takahashi ........... H10D 30/701 |

OTHER PUBLICATIONS

U.S. Appl. No. 16/887,244, filed Mar. 29, 2020 by inventors Tai-Yen Peng et al., for "Magnetic Tunnel Junction Device and Method," 42 pages of text, 45 pages of drawings.

U.S. Appl. No. 17/224,309, filed Apr. 7, 2020, by inventors Yu-Feng Yin for "Top Interconnection Metal Lines for a Memory Array Device and Methods for Forming the Same," 57 pages of text, 25 pages of drawings.

U.S. Appl. No. 17/008,000, filed Aug. 31, 2020, by inventors Yu-Feng Yin et al., "Semiconductor Device and Manufacturing Method Thereof," 26 pages of texts, 23 pages of drawings.

* cited by examiner

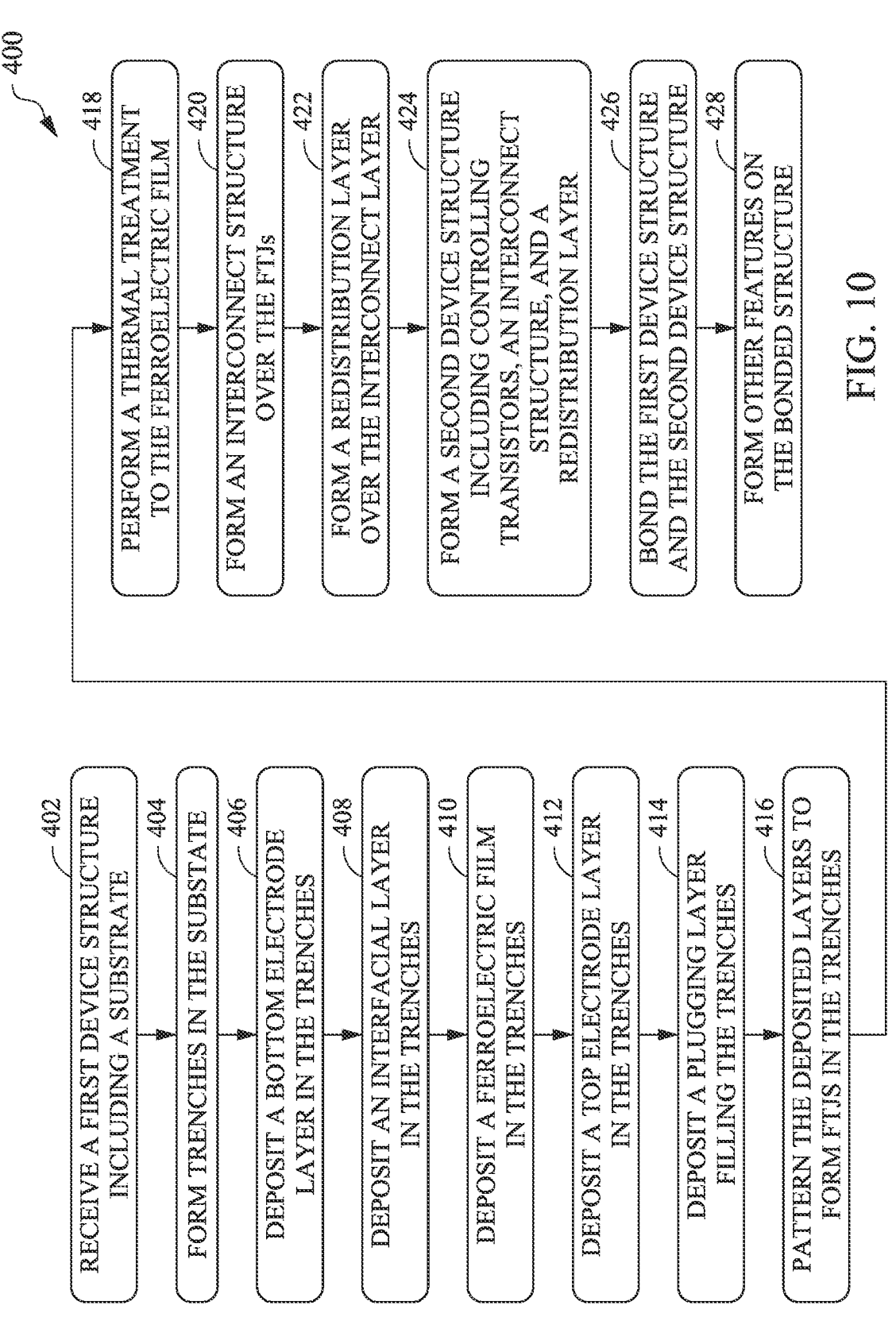

400

402 — RECEIVE A FIRST DEVICE STRUCTURE INCLUDING A SUBSTRATE

404 — FORM TRENCHES IN THE SUBSTATE

406 — DEPOSIT A BOTTOM ELECTRODE LAYER IN THE TRENCHES

408 — DEPOSIT AN INTERFACIAL LAYER IN THE TRENCHES

410 — DEPOSIT A FERROELECTRIC FILM IN THE TRENCHES

412 — DEPOSIT A TOP ELECTRODE LAYER IN THE TRENCHES

414 — DEPOSIT A PLUGGING LAYER FILLING THE TRENCHES

416 — PATTERN THE DEPOSITED LAYERS TO FORM FTJS IN THE TRENCHES

418 — PERFORM A THERMAL TREATMENT TO THE FERROELECTRIC FILM

420 — FORM AN INTERCONNECT STRUCTURE OVER THE FTJs

422 — FORM A REDISTRIBUTION LAYER OVER THE INTERCONNECT LAYER

424 — FORM A SECOND DEVICE STRUCTURE INCLUDING CONTROLLING TRANSISTORS, AN INTERCONNECT STRUCTURE, AND A REDISTRIBUTION LAYER

426 — BOND THE FIRST DEVICE STRUCTURE AND THE SECOND DEVICE STRUCTURE

428 — FORM OTHER FEATURES ON THE BONDED STRUCTURE

FIG. 10

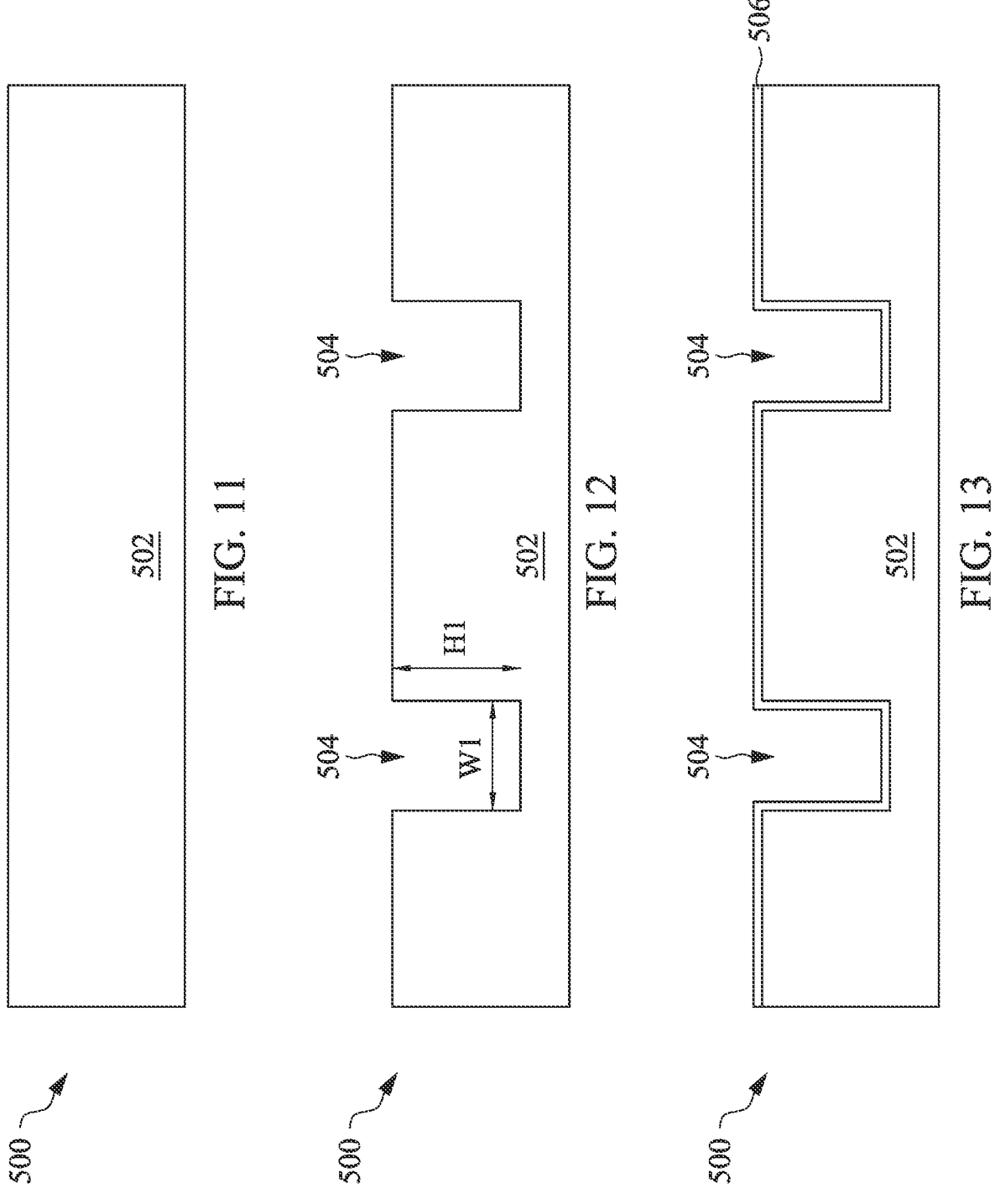

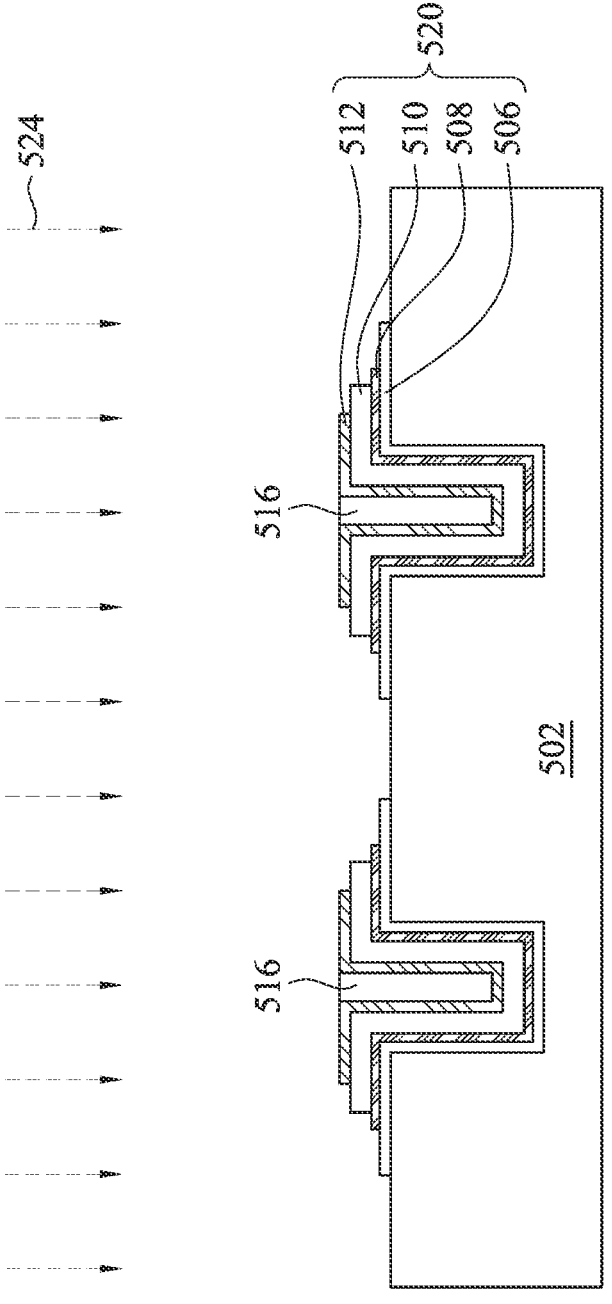
FIG. 20

FERROELECTRIC-BASED MEMORY DEVICE AND METHOD OF FORMING THE SAME

PRIORITY DATA

This application claims the benefit of U.S. Provisional Application No. 63/346,084 filed May 26, 2022 and U.S. Provisional Application No. 63/382,243 filed Nov. 3, 2022, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

The scaling down process has prompted circuit designers to move devices from the front-end-of-line (FEOL) level to the back-end-of-line (BEOL) level where the interconnect structure resides. For example, ferroelectric-based memory devices may be formed at the BEOL level. Forming ferroelectric-based memory devices at the BEOL level is not without challenges. For example, it may be difficult to achieve a desired crystallization when growing ferroelectric films due to insufficient thermal treatment as excessive heat may damage FEOL features. While existing processes and structures of ferroelectric-based memory devices may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10 illustrates a flow chart of a method for forming a memory device, according to various aspects of the present disclosure.

FIGS. 11, 12, 13, 14, 15, 16, 17, 18, 19, 20, 21, 22, 23, 24, 25, and 26 illustrate cross-sectional views of a memory device during a fabrication process according to the method of FIG. 10, according to one or more aspects of the present disclosure.

DETAILED DESCRIPTION

Figure 1:
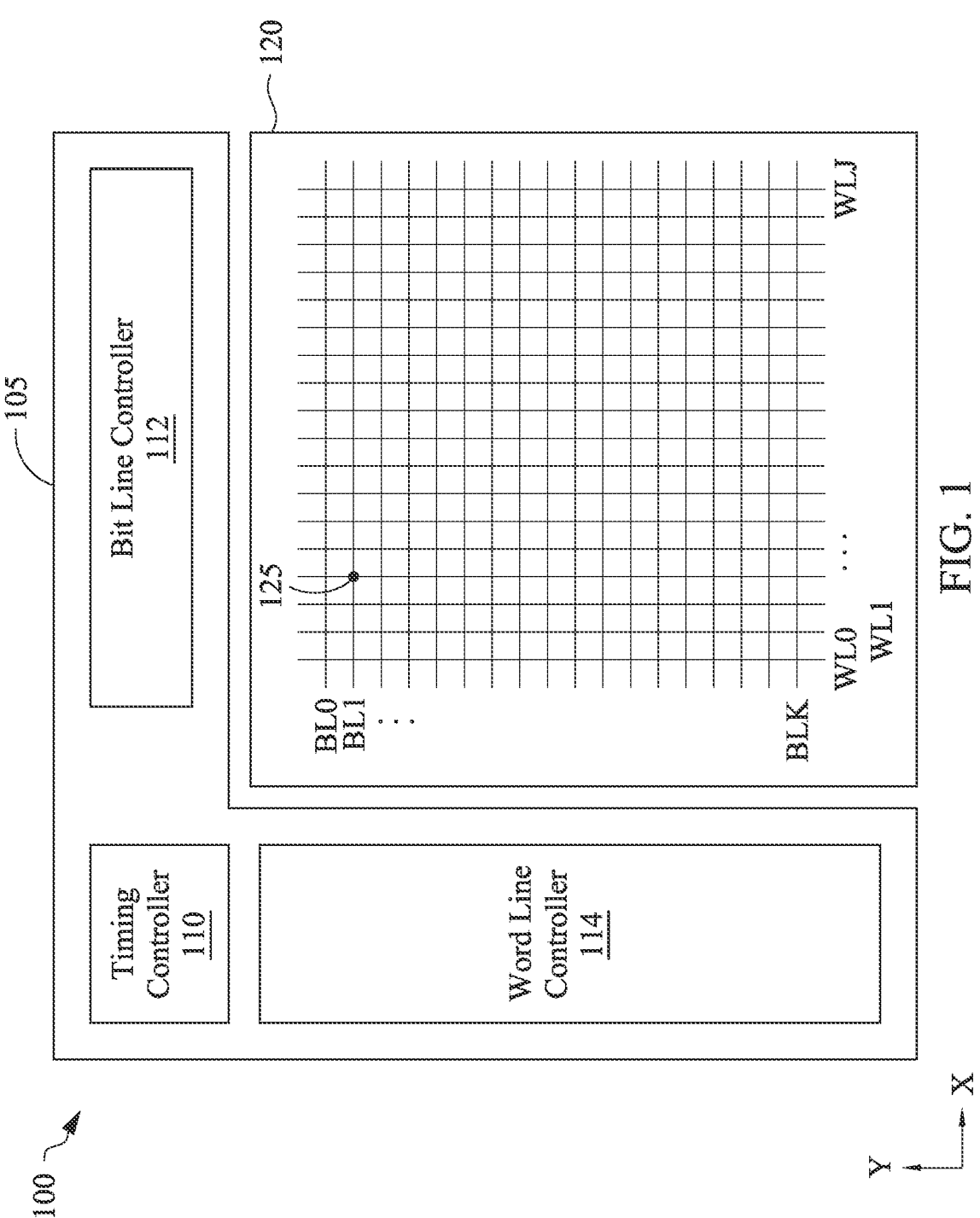
FIG. 1 is a diagram of a memory system, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure relates generally to manufacturing memory devices, and more particularly, to manufacturing logic devices and memory array in separate wafers and bonding the separate wafers together by wafer-on-wafer (WOW) process.

IC manufacturing process flow is typically divided into three categories: front-end-of-line (FEOL) processes, middle-end-of-line (MEOL) process, and back-end-of-line (BEOL) processes. FEOL processes generally encompass processes related to fabricating IC devices, such as transistors. For example, FEOL processes can include forming isolation features, channel features, gate structures, and source and drain features (generally referred to as source/drain features). MEOL processes generally encompass processes related to fabricating contacts to multi-gate devices, such as fin-type field effect transistors (FinFETs) or gate-all-around (GAA) transistors (also known as multi-bridge-channel (MBC) transistors or surrounding gate transistors (SGTs)). Example MEOL features include contacts to the gate structures and/or the source/drain features of a multi-gate transistor. BEOL processes generally encompass processes related to fabricating a multilayer interconnect (MLI) feature that interconnects FEOL IC features, thereby enabling operation of the IC devices. To save real estate at the FEOL level, larger devices that do not require the level of photolithographic precisions for transistors may be moved to BEOL structures. For example, memory devices, such as magnetic-based memory devices (e.g., magnetic tunnel junction (MTJ) memory devices) and ferroelectric-based memory devices (e.g., ferroelectric tunnel junction (FTJ) memory devices), may be fabricated at the BEOL level.

A ferroelectric-based memory device (or ferroelectric memory device) is a nonvolatile memory (i.e., a memory that can store data in the absence of power). A ferroelectric memory device, such as a ferroelectric field effect transistor (FeFET), a ferroelectric random-access memory (FeRAM or FRAM) device, or a ferroelectric tunnel junction (FTJ) memory device, typically has a ferroelectric film (also referred to as ferroelectric layer) sandwiched between a bottom electrode and a top electrode. An interfacial layer, also referred to as a non-polarization layer, is formed between the ferroelectric film and one of the neighboring electrodes. The formation of the non-polarization layer is important to create remnant polarization, on which the ferroelectric memory device relies for proper functioning. In an FeRAM, a thick ferroelectric film is sandwiched between two electrodes and the remnant polarization is switched by applying an electric field between the two electrodes. Although the thick ferroelectric film makes it relatively easy to form a non-polarization layer, the readout current across the thick ferroelectric film tends to be low, which creates challenges for miniaturization or integration into the BEOL structures. On the other hand, an FTJ memory includes a thin ferroelectric film (measured in nanometers) which allows quantum-mechanical tunneling. However, when the ferroelectric film gets thinner (e.g., less than 5 nm), the formation of non-polarization layer becomes difficult and the polarization property of the ferroelectric film starts to disappear, which leads to malfunction of the memory device.

It has been observed that sufficient thermal treatment of a ferroelectric film in ferroelectric memory devices is beneficial to achieve crystallization and good ferroelectricity. In some existing technologies, the thermal treatment of the ferroelectric layer is proceeded with caution as excessive heat may cause deterioration of FEOL structures, such as the gate structure in transistors. Oftentimes the temperature of the thermal treatment is kept below 400° C., which may cause insufficient crystallization of the ferroelectric film.

The present disclosure provides a process and a ferroelectric memory device (e.g., an FTJ memory structure) to achieve crystallization of the ferroelectric layer without causing unintended damages to the FEOL structures. The ferroelectric memory device of the present disclosure uses a wafer-on-wafer process to fabricate logic device (usually formed in FEOL) and ferroelectric memory device (including ferroelectric film) (usually formed in MEOL or BEOL) separately to overcome thermal constraint and prevent high temperatures affecting elements in the logic device. By wafer-on-wafer technique, no thermal limitation is in forming the ferroelectric film, as FEOL structures are in a different wafer and not subject to the thermal treatment of the wafer that the ferroelectric film is located. The wafer that hosts the ferroelectric film can be subject to a thermal treatment with a temperature larger than about 550° C., such as between about 550° C. and about 1000° C. without subjecting the FEOL structures to excessive heat. Thus, the crystallization quality of the ferroelectric film is increased, and the performance of the ferroelectric memory devices is improved with little or no risk of damaging the FEOL structure. Throughout the present disclosure, embodiments based on an FTJ memory device are given for illustration purpose. The illustrated FTJ memory device is, of course, merely an example and is not intended to be limiting. As discussed above, a ferroelectric film that supports ferroelectric memory applications can be applied to FeFET memory devices, FeRAM memory devices, or FTJ memory devices. Further, many other modern-day electronic devices including electronic memory may also benefit from the wafer-on-wafer process by treating the MEOL/BEOL structures separately from the FEOL structures. Examples of next generation electronic memory include resistive random-access memory (RRAM), phase-change random-access memory (PCRAM), and magneto-resistive random-access memory (MRAM).

The various aspects of the present disclosure will now be described in more detail with reference to the figures. Throughout the present disclosure, unless expressly otherwise described, like reference numerals denote like features.

FIG. 1 is a diagram of a memory system 100, in accordance with some embodiments. The memory system 100 includes a memory controller 105 and a memory array 120. The memory array 120 is a hardware component that stores data. In one aspect, the memory array 120 is embodied as a semiconductor memory device. The memory array 120 includes a plurality of storage circuits or memory cells 125. The memory cells 125 may be arranged in two- or three-dimensional arrays. The memory array 120 also includes bit lines BL0, BL1 . . . BLK, each extending in a first direction (e.g., X-direction) and word lines WL0, WL1 . . . WLJ, each extending in a second direction (e.g., Y-direction). The word lines WL and the bit lines BL may be conductive metals or conductive rails. In one aspect, each memory cell 125 is coupled to a corresponding word line WL and a corresponding bit line BL, and can be operated according to voltages or currents through the corresponding word line WL and the corresponding bit line BL. Each memory cell 125 may be coupled to a corresponding word line WL and a corresponding bit line BL. Since memory cells 125 are arranged at cross points of BLs and WLs, such a memory system 100 is also referred to as a cross-point memory architecture.

In a cross-point memory array, a memory cell 125 may comprise a data-storage element. In some embodiments, a resistance of the data-storage element varies depending upon a data state of the data-storage element. For example, the data-storage element may have a low resistance at a first data state and may have a high resistance at a second data state. In other embodiments, capacitance or some other suitable parameter of the data-storage element varies depending upon a data state of the data-storage element. In some embodiments, the data-storage element is a metal-insulator-metal (MIM) stack, and the memory cell 125 may be a resistance memory cell. In furtherance of the embodiments, the data-storage element is an FTJ or an MTJ. Other structures for the data-storage element and/or other memory-cell types for the memory cell 125 are also amenable.

When FTJ is configured as the data-storage element in a memory cell, a cross-point memory array may, for example, comprise multiple one-transistor one-FTJ (1T1F) memory cells respectively arranged at cross points of bit lines and source lines. The transistor is configured to pass current through the FTJ when biased above respective threshold voltages. By appropriately biasing a bit line and a source line, a 1T1F memory cell at a cross point of the bit line and the source line can be selected and written to opposite states. When a 1T1F memory cell is selected, other bit lines and source lines may be biased at a middle point voltage to turn off unselected memory cells. To achieve higher density, a cross-point memory architecture alternatively may implement a configuration of 1TNF, in which multiple FTJ memory cells may share one transistor, without a need of a cross-coupled transistor for each memory cell.

The memory controller 105 may write data to or read data from the memory array 120 according to electrical signals through word lines WL and bit lines BL. In other embodiments, the memory system 100 includes more, fewer, or different components than shown in FIG. 1. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. In one configuration, the word line controller 114 is a circuit that provides a voltage or a current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. The bit line controller 112 may be coupled to bit lines BL of the memory array 120, and the word line controller 114 may be coupled to word lines WL of the memory array 120. In one example, to write data to a memory cell 125, the word line controller 114 provides a voltage or current to the memory cell 125 through a word line WL coupled to the memory cell 125, and the bit line controller 112 applies a bias voltage to the memory cell 125 through a bit line BL coupled to the memory cell 125. In one example, to read data from a memory cell 125, the word line controller 114 provides a voltage or current to the memory cell 125 through a word line WL coupled to the memory cell 125, and the bit line controller 112 senses a voltage or current corresponding to data stored by the memory cell 125 through a bit line BL coupled to the memory cell 125. In some embodiments, the memory controller 105 includes more, fewer, or different components than shown in FIG. 1.

Figure 2:
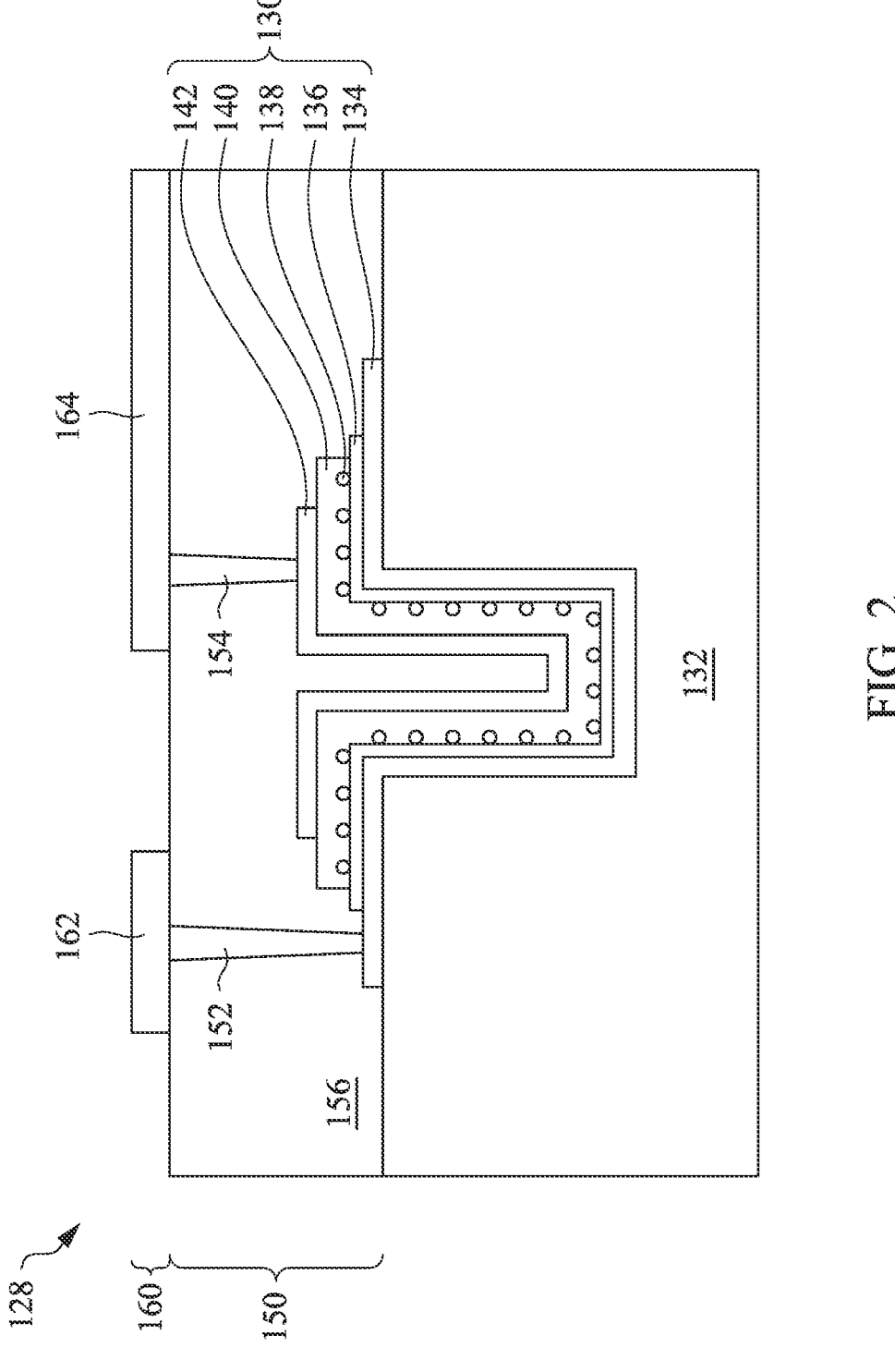
FIGS. 2, 3A, 3B, 3C, and 3D illustrate cross-sectional views of various embodiments of a data-storage element in a memory cell, according to various aspects of the present disclosure.

FIG. 2 illustrates a data-storage element 128 as in a memory cell 125 which is a building block of the memory array 120 as shown in FIG. 1. The data-storage element 128 includes an FTJ 130 embedded in a substrate 132. The FTJ 130 includes at least a layer of ferroelectric material, which generally refers to a material that exhibits polarization upon application of an electric field thereto and continues to exhibit polarization upon removal (or reduction) of the electric field. Accordingly, the ferroelectric material is also known as polarization material. Generally, the ferroelectric material has intrinsic electric dipoles that can be switched between polarization states by the electric field, such as between a first polarization state and a second polarization state. The first polarization state can correspond with a first data state, such as a logical "1" (e.g., a first resistance or a first capacitance depending on the ferroelectric memory device). The second polarization state can correspond with a second data state, such as a logical "0" (e.g., a second resistance or a second capacitance depending on the ferroelectric memory device).

In the illustrated embodiment, the FTJ 130 is disposed in a deep trench formed in the substrate 132. The deep trench is usually formed with a high aspect ratio (depth over width). Therefore, sidewalls of the various layers, including bottom electrode 134, interfacial layer 136, discontinuous seed structure 138 (also referred to as a ferroelectric promotional structure), ferroelectric film 140, and top electrode 142, are further extended down in the substrate 132. The charging areas can be increased accordingly, which saves the FTJ volume and helps achieving a high-density layout. In some embodiments, the aspect ratio of the deep trench in which the FTJ 130 is deposited ranges from about 5 to about 30.

The substrate 132 includes a semiconductor material, such as silicon. In one embodiment, the substrate 132 may include other semiconductor materials, such as silicon germanium, silicon carbide, gallium arsenide, or the like. In the present embodiment, the substrate 132 is a p-type semiconductive substrate (acceptor type) or n-type semiconductive substrate (donor type). Alternatively, the substrate 132 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 132 is a semiconductor-on-insulator (SOI). In other alternatives, the substrate 132 may include a doped epitaxial layer, a gradient semiconductor layer, and/or a semiconductor layer overlying another semiconductor layer of a different type, such as a silicon layer on a silicon germanium layer. In furtherance of embodiments, the substrate 132 may include a dielectric layer overlaying a semiconductor layer, such as an interlayer dielectric (ILD) layer on a silicon layer, and the deep trench is formed in the ILD layer during BEOL process.

The bottom electrode 134 may be conformally deposited on sidewalls and bottom surface of the deep trench. The bottom electrode 134 also covers a portion of the top surface of the substrate 132 outside of the deep trench. The bottom electrode 134 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, or the like. In some embodiments, the bottom electrode 134 may be formed of TiN, Ru, W, Mo, TaN, or the like. The bottom electrode 134 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. A thickness of the bottom electrode 134 may be in a range from 10 nm to 100 nm, although lesser and greater thicknesses may also be used.

The interfacial layer 136 may be conformally deposited on the bottom electrode 134. The interfacial layer 136 includes a non-polarization material. The interfacial layer 136 is also referred to as a non-polarization layer. The interfacial layer 136 may include a high-k dielectric material having a dielectric constant greater than 3.9 and may include, but are not limited to, silicon nitride (SiNx), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$) (HZO)), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), combinations thereof, or the like. Other suitable dielectric materials are within the scope of the present disclosure. The interfacial layer 136 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. A thickness of the interfacial layer 136 may be less than about 2 nm. The thickness is not trivial. If the thickness of the interfacial layer 136 is larger than about 2 nm, the read current flowing through the FTJ 130 may become too small to be sensed, and/or differences between logical states may become too small to be discerned.

The seed structure 138 may be a discontinuous layer of metal particles, which may include discrete metal atoms or discrete metal nanoparticles. The seed structure 138 may be a discontinuous layer, such that the seed structure 138 does not form an electrically conductive path on the surface of the interfacial layer 136. In various embodiments, the seed structure 138 does not form a continuous metal layer on the interfacial layer 136. The seed structure 138 may have thickness, and/or seed metal particles may have an average particle size, ranging from about 1 Å (angstrom) to about 20 Å, such as from about 1 Å to about 10 Å, or from about 1 Å to about 5 Å. In some embodiments, the seed structure 138 may be a partial mono-layer of seed metal atoms. For example, the seed structure 138 may include from about ¼ to about ¾ of the seed metal atoms included in a full mono-layer of seed metal atoms. The seed structure 138 may be formed by depositing a seed metal using any suitable deposition process. For example, the seed structure 138 may be formed using physical vapor deposition (PVD), chemical vapor deposition (CVD), atomic layer deposition (ALD), or the like. However other suitable processes for forming a discontinuous layer of seed metal may be used.

The ferroelectric film 140 includes a ferroelectric material (polarization material). The ferroelectric film 140 is also referred to as a polarization layer. The ferroelectric film 140 may be a single layer or a multi-layer structure, such as a first ferroelectric layer disposed over a second ferroelectric layer, wherein the first ferroelectric layer and the second ferroelectric layer have different compositions. The ferroelectric material can be a high-k dielectric material, such as a dielectric material having a dielectric constant (k) greater than about 28 (e.g., k≥28), having an orthorhombic crystal structure. In some embodiments, the ferroelectric film 140 includes a metal oxide material or a metal oxynitride material. For example, the ferroelectric film 140 may include a hafnium oxide-based material or a zirconium oxide-based material. In furtherance of the example, the ferroelectric film 140 can include hafnium oxide (e.g., $Hf_xO_y$), hafnium zirconium oxide (e.g., $Hf_xZr_zO_y$)(also referred to as HZO), hafnium aluminum oxide (e.g., $Hf_xAl_zO_y$), hafnium lanthanum oxide (e.g., $Hf_xLa_zO_y$), hafnium cerium oxide (e.g., $Hf_xCe_zO_y$), hafnium silicon oxide ($Hf_xSiO_y$), hafnium gadolinium oxide (e.g., $Hf_xGd_zO_y$), other suitable $Hf_xO_y$-based material, or combinations thereof, where x, y, z are atom percentages. In another example, the ferroelectric film 140 can include a $Zr_jO_k$-based material, where j, k, z are atom percentages. The ferroelectric film 140 may be formed by depositing a ferroelectric material using any suitable deposition method, such as PVD, spin coating and annealing, sputtering, CVD, ALD, plasma-enhanced chemical vapor deposition (PECVD), spray pyrolysis, pulsed laser deposition (PLD) or combinations thereof. During the deposition process, the seed metal may promote the growth of a desired crystal phase in the ferroelectric film 140. For example, when the ferroelectric film 140 comprises a Hf-based ferroelectric material, the primary crystal phase of the ferroelectric film 140 may have an orthorhombic crystal structure. If the ferroelectric film 140 comprises a Pb-based material, such as PBT or PZT, the primary crystal phase of the ferroelectric film 140 may have a tetragonal crystal structure. In particular, the primary crystal phase may account for at least 50%, such as from about 60% to about 99.9%, or from about 70% to about 95% of the ferroelectric film 140. In some embodiments, a thickness of the ferroelectric film 140 is less than about 5 nm. The thickness is not trivial. If the thickness of the ferroelectric film 140 is larger than about 5 nm, the quantum-mechanical tunneling effect may become insignificant and deteriorate FTJ performance. In some embodiments, the ferroelectric film 140 may be thermally annealed, to further improve the crystal structure thereof. For example, the ferroelectric film 140 may be annealed using Excimer-laser annealing (ELA), flash lamp annealing (FLA), furnace annealing, or the like.

The top electrode 142 may be deposited on the ferroelectric film 140. The top electrode 142 may include, and/or may consist essentially of, at least one of a transition metal, a conductive metallic nitride, and a conductive metallic carbide. Exemplary metallic materials that may be used for the top electrode 142 include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode 142 may include, and/or may consist essentially of, an elemental metal such as W, Cu, Ti, Ta, Ru, Co, Mo, or Pt. The thickness of the top electrode 142 may be in a range from 10 nm to 100 nm, although lesser and greater thicknesses may also be used.

Still referring to FIG. 2, an interconnect structure 150 is disposed over the FTJ 130. The interconnect structure 150 is usually formed in BEOL process and configured to electrically couple the FTJ 130 with another layer. In some embodiments, the interconnect structure 150 electrically couples the FTJ 130 with the overlaying metal layer 160. The interconnect structure 150 may include conductive vias 152 and 154, and an inter-layer dielectric (ILD) 156. The conductive vias 152 and 154 are formed in the ILD 156, and electrically coupled to the bottom electrode 134 and the top electrode 142 of the FTJ 130, respectively. The conductive vias 152 and 154 may be formed of conductive materials, such as aluminum, gold, silver and tungsten. The ILD 156 may be formed from a variety of dielectric materials, such as oxide (e.g., Ge oxide), oxynitride (e.g., GaP oxynitride), silicon dioxide ($SiO_2$), nitrogen-bearing oxide (e.g., nitrogen-bearing $SiO_2$), nitrogen-doped oxide (e.g., $N_2$-implanted $SiO_2$), silicon oxynitride ($Si_xO_yN_z$), and the like.

The metal layer 160 is disposed over the interconnect structure 150. The metal layer 160 is configured to electrically couple the FTJ 130 to a redistribution layer for electrical connection with devices or components in another substrate (e.g., another wafer). The metal layer 160 may include metal lines 162 and 164 electrically coupled to the conductive vias 152 and 154, respectively. The metal lines 162 and 164 may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu).

Figure 3A:
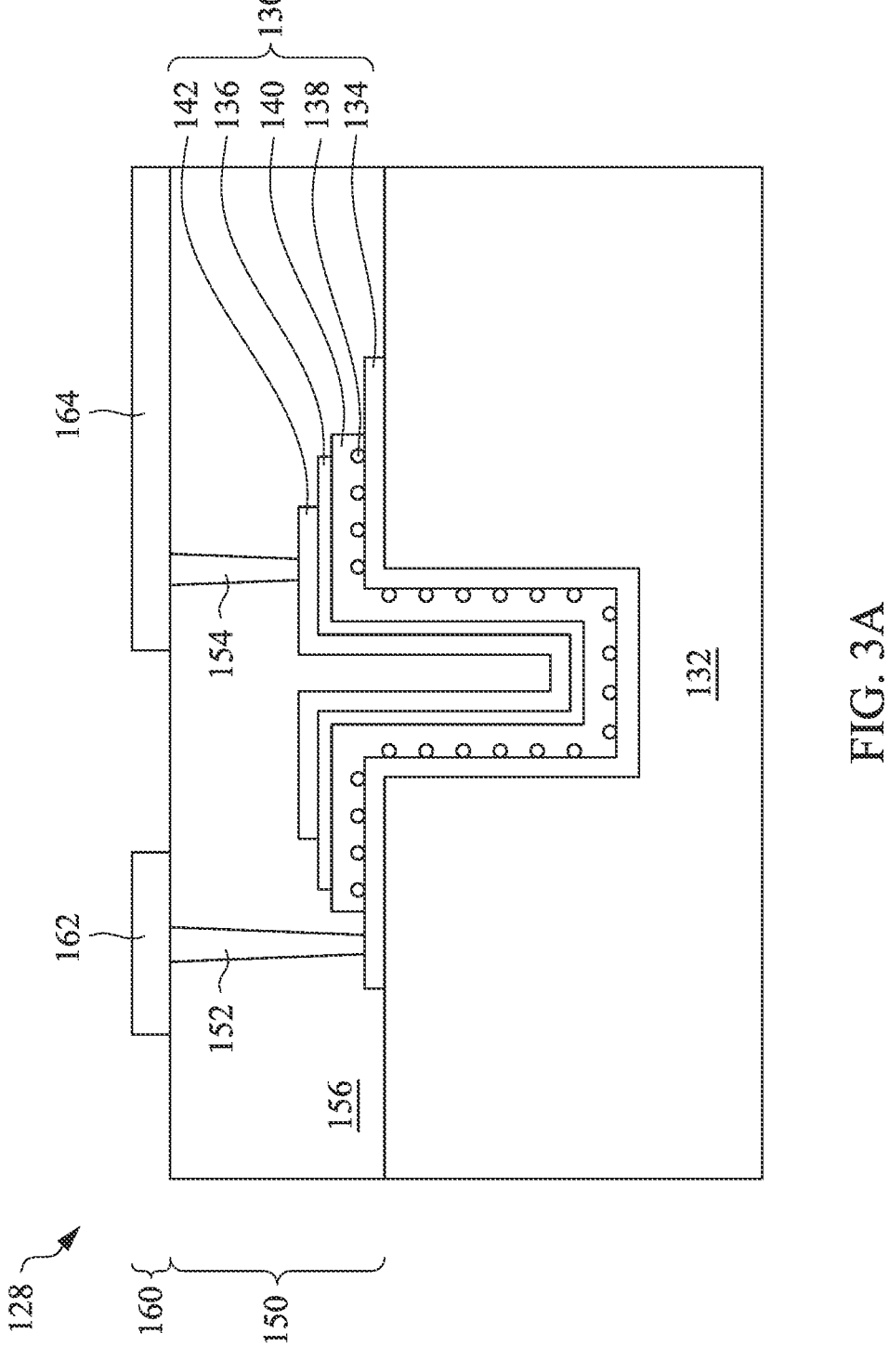

FIGS. 3A-3D illustrate alternative embodiments of the data-storage element 128 as shown in FIG. 2. Referring to FIG. 3A, one difference with the depicted embodiment in FIG. 2 is that the interfacial layer 136 is sandwiched between the ferroelectric film 140 and the top electrode 142. Accordingly, the seed structure 138 is formed on the bottom electrode 134 and the ferroelectric film 140 is formed on the seed structure 138 and positioned under the interfacial layer 136.

Figure 3B:
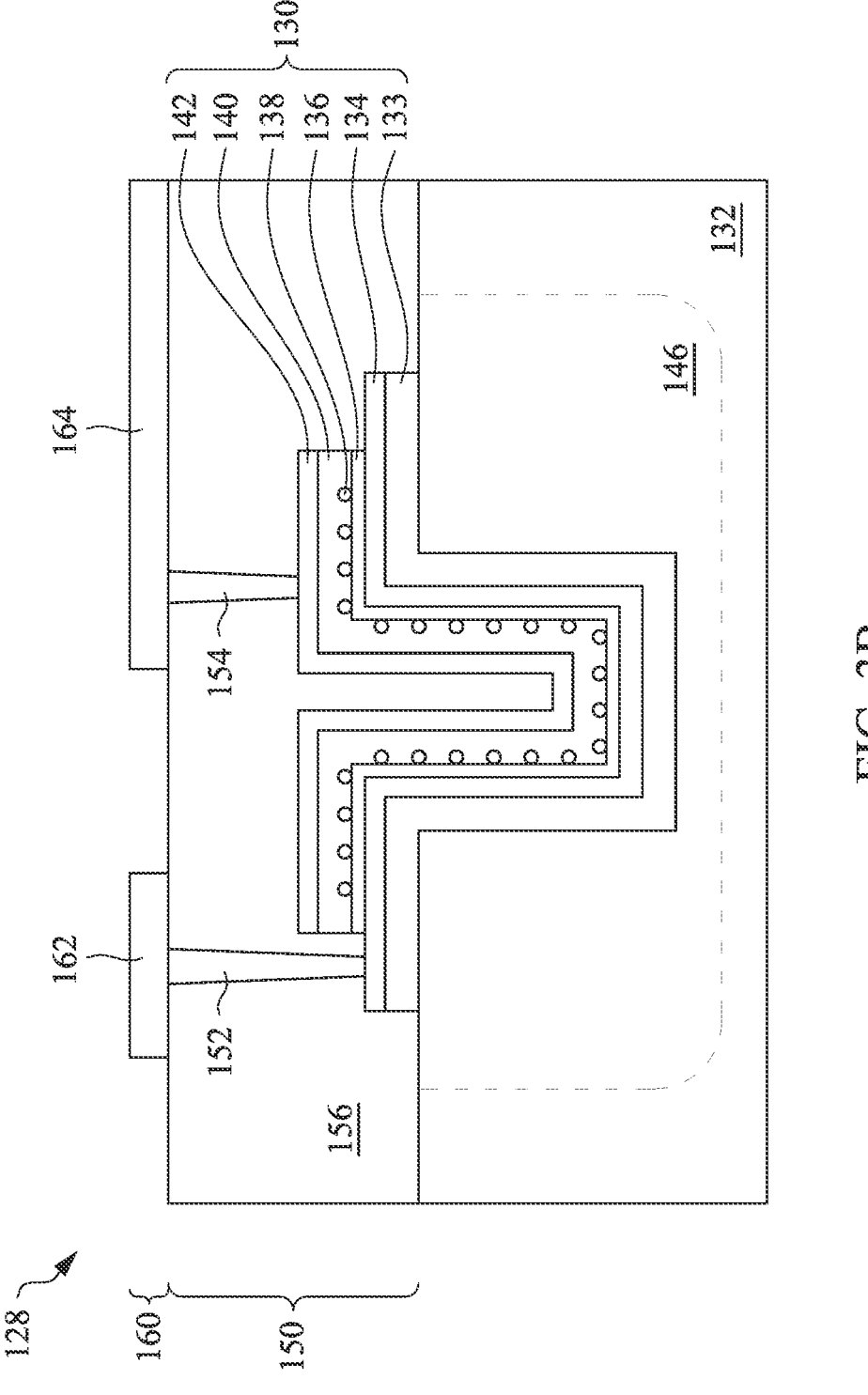

Referring to FIG. 3B, one difference with the depicted embodiment in FIG. 2 is that the deep trench is formed inside a doped region 146. The doped region 146 is in the substrate 132. In some embodiments, the doped region 146 is a p-well structure, an n-well structure or a twin well structure. The doping concentration in the doped region 146 is greater than the substrate 132. In an embodiment, the doped region 146 includes a first dopant type opposite to a second dopant type of the substrate 132. For example, the substrate 132 is an n-type substrate, and the doped region 146 is a p-type well. The doped region 146 is configured with the substrate 132 as a reversed bias p-n junction to suppress substrate current leakage. Optionally, with or without the doped region 146, the FTJ 130 may further include a dielectric layer 133 under the bottom electrode 134. The dielectric layer 133 provides electrical insulation between the FTJ 130 and the substrate 132. In some embodiments, the dielectric layer 133 is made of dielectric materials, such as a high-k dielectric material. Examples of high-k dielectric materials include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In addition, the thickness of the dielectric layer 133 is designed to be relatively thin. That would save the volume in the deep trench. In some embodiments, a thickness of the dielectric layer 133 is smaller than a thickness of the ferroelectric film 140.

Still referring to FIG. 3B, yet another difference with the depicted embodiment in FIG. 2 is that except a portion of the top surface of the bottom electrode 134 and the top surface of the top electrode 142 are exposed for landing the conductive vias 152 and 154, top surfaces of other layers in the FTJ 130, including the dielectric layer 133, the interfacial layer 136, the ferroelectric film 140, are covered. This can be controlled during the patterning process after the deposition of the various layers in the FTJ 130. By exposing sidewalls but not top surfaces of those relative sensitive layers in the FTJ 130, the FTJ 130 is better protected against damages during subsequent manufacturing processes.

Figure 3C:
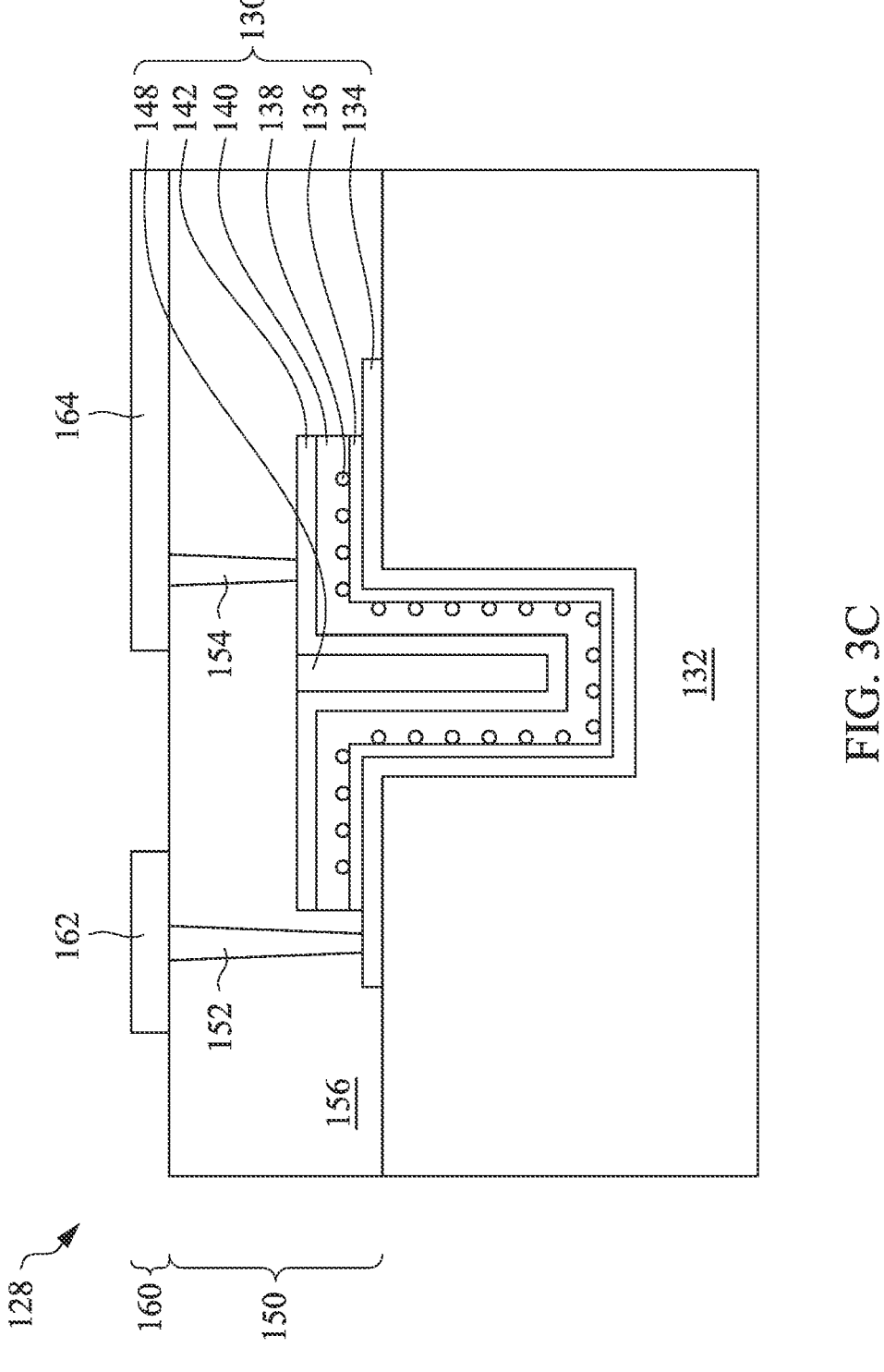

Referring to FIG. 3C, one difference with the depicted embodiment in FIG. 2 is that the trench surrounded by the top electrode 142 is filled with a plug 148, which is different from the dielectric material in the ILD 156. The plug 148 possesses a high aspect ratio that is larger that the deep trench. In some embodiments, the aspect ratio of the plug 148 ranges from about 30 to about 50. In some embodiments, the plug 148 has parallel sidewalls from a cross-sectional view as depicted in FIG. 3C. In some embodiments, the plug 148 has tapered sidewalls from its top surface to its bottom surface. That is, a width of the plug 148 measured from its top surface may be greater than the width measured from any other locations away from its top surface. The plug 148 strengthens mechanical strength of the high-aspect ratio FTJ 130 and may further functions as an extension of the top electrode 142 if it is formed of semiconductor material or conductive material. In some embodiments, the plug 148 includes a dielectric material, such as a high-k dielectric material. Examples of high-k dielectric materials include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In some embodiments, the plug 148 includes a semiconductor material, such as polysilicon. In some embodiments, the plug 148 includes a conductive material other than the top electrode 142, such as copper, aluminum, gold, silver, or tungsten.

Figure 3D:
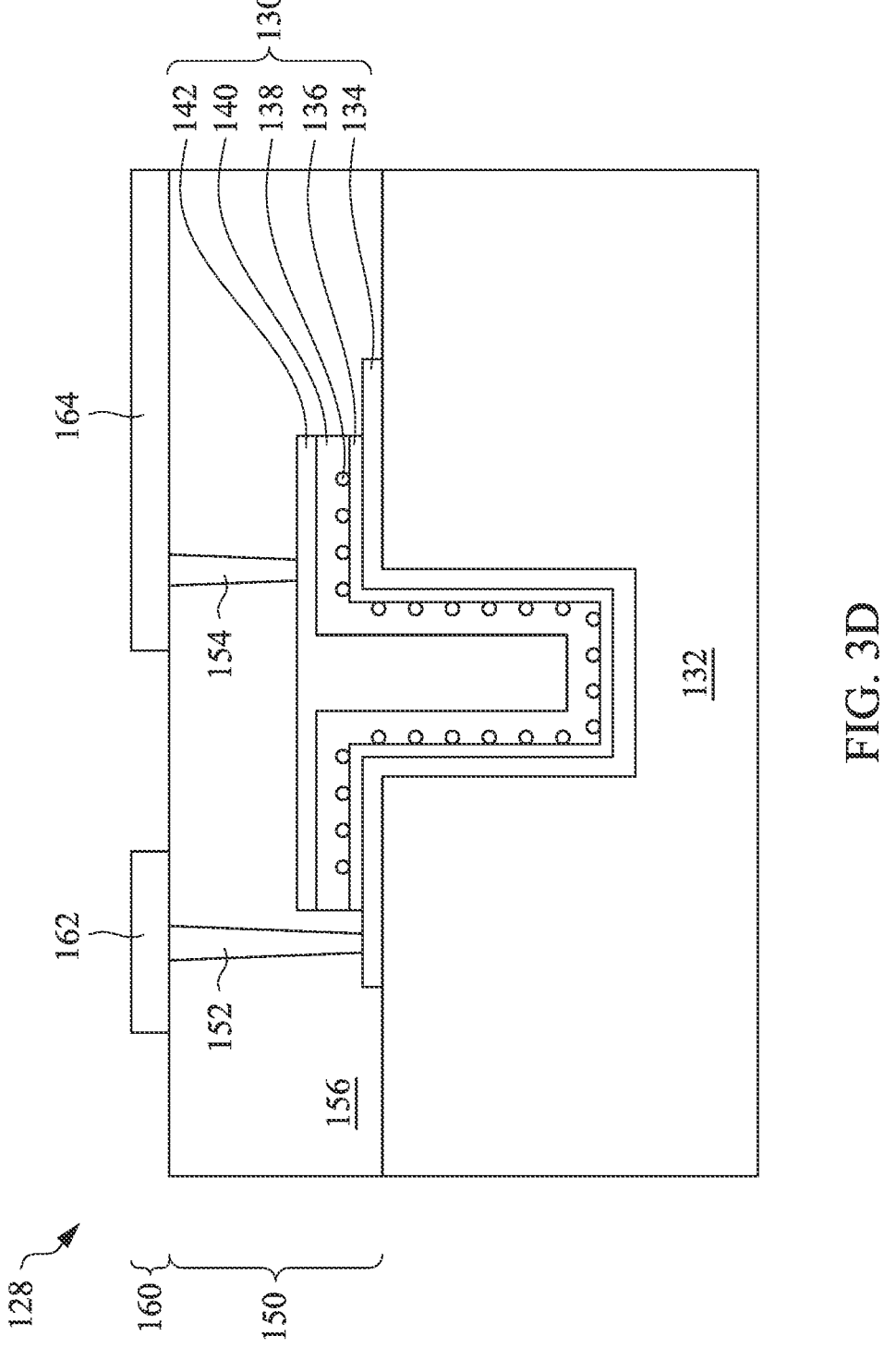

Referring to FIG. 3D, one difference with the depicted embodiment in FIG. 2 is that the conductive material of the top electrode 142 fully fills the remaining volume of the deep trench. The conductive material of the top electrode 142 may first be deposited on the substrate 132 and in the deep trench as a bulk material and subsequently thinned down by a planarization process, such as by a chemical mechanical polishing (CMP) process. Each of the alternative embodiments of the features discussed above in FIGS. 3A-3D, such as the positions of the interfacial layer 136 and the ferroelectric film 140 in FIG. 3A, the doped region 146 in FIG. 3B, the dielectric layer 133 in FIG. 3B, the covered top surfaces in FIG. 3B, the plug 148 in FIG. 3C, and the bulk conductive material of the top electrode 142 in FIG. 3D, may be independently applied to each of the embodiments depicted in FIGS. 2 and 3A-3D.

Figure 4A:
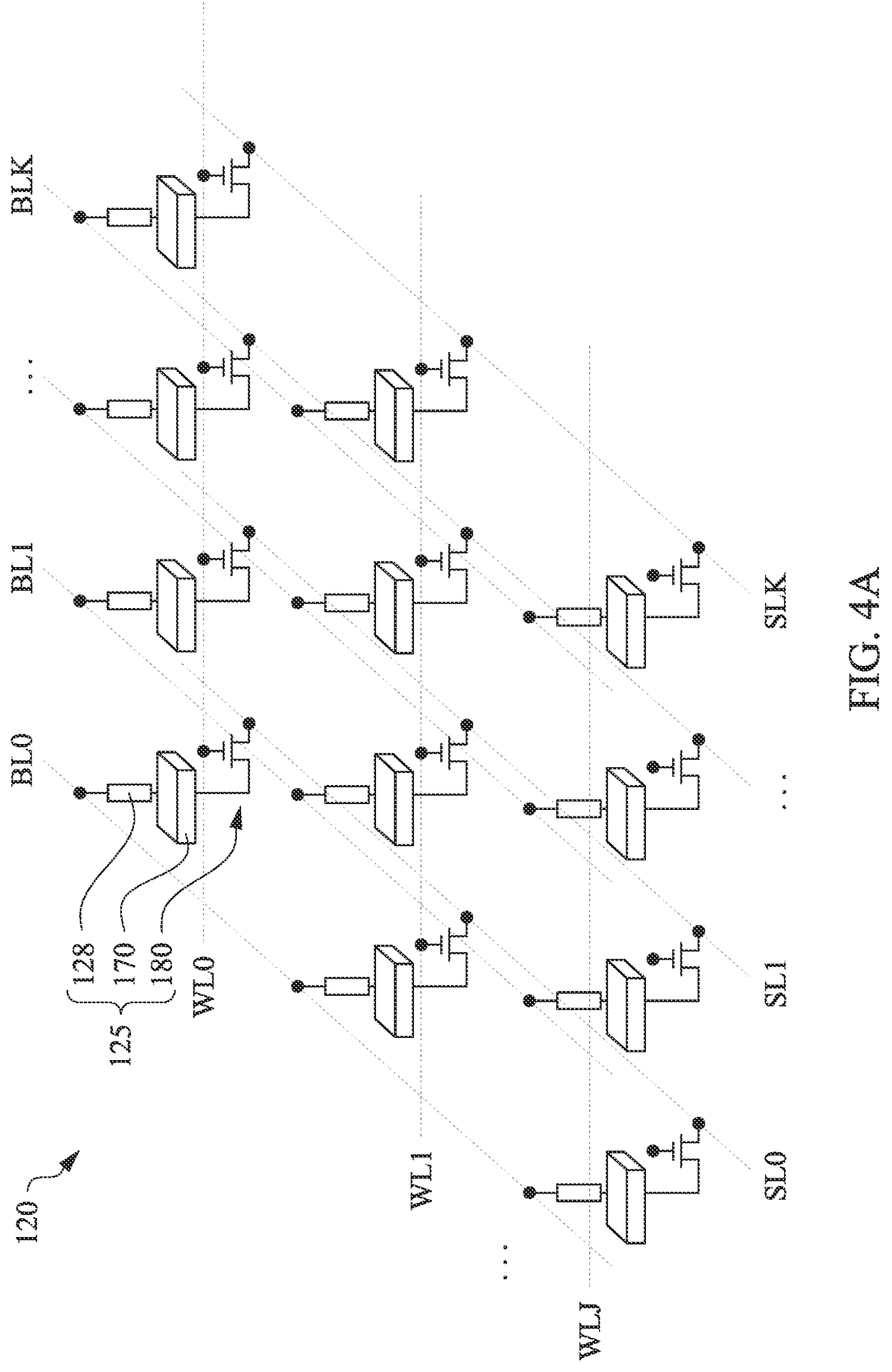
FIGS. 4A and 4B are schematic views of some embodiments of a memory array comprising a plurality of memory cells, according to various aspects of the present disclosure.

With reference to FIG. 4A, a schematic view of some embodiments of a memory array 120 comprising a plurality of memory cells 125 in a plurality of rows and a plurality of columns is provided. The memory cells 125 respectively comprises the data-storage element 128 electrically coupled in series with a control transistor 180 through a bonding pad 170. The bonding pad 170 is a part of a bonded structure of two redistribution layers from two wafers, one disposed in a top wafer in which the data-storage elements 128 are formed, another disposed in a bottom wafer in which the control transistors 180 (and other FEOL structures) are formed. The memory cells 125 may, for example, each be as illustrated and described with regard to FIGS. 1-3D. As an example, bit lines (e.g. BL0, BL1 . . . BLK) extend laterally along corresponding columns of the memory array and electrically couple with memory cells in the corresponding columns, whereas word lines (e.g. WL0, WL1 . . . WLJ) extend laterally along corresponding rows of the memory array and electrically couple with memory cells in the corresponding rows. The subscripts identify corresponding rows or columns, and K or J is an integer variable representing a column or a row in the memory array 120. By appropriately biasing a bit line BL and a word line WL, the memory cell at the cross point of the bit line BL and the word line WL may be selected for reading or writing though source lines (e.g., SL0, SL1 . . . SLK). Each data-storage element 128 is electrically coupled to a corresponding control transistor 180 through a bonding pad 170.

Figure 4B:
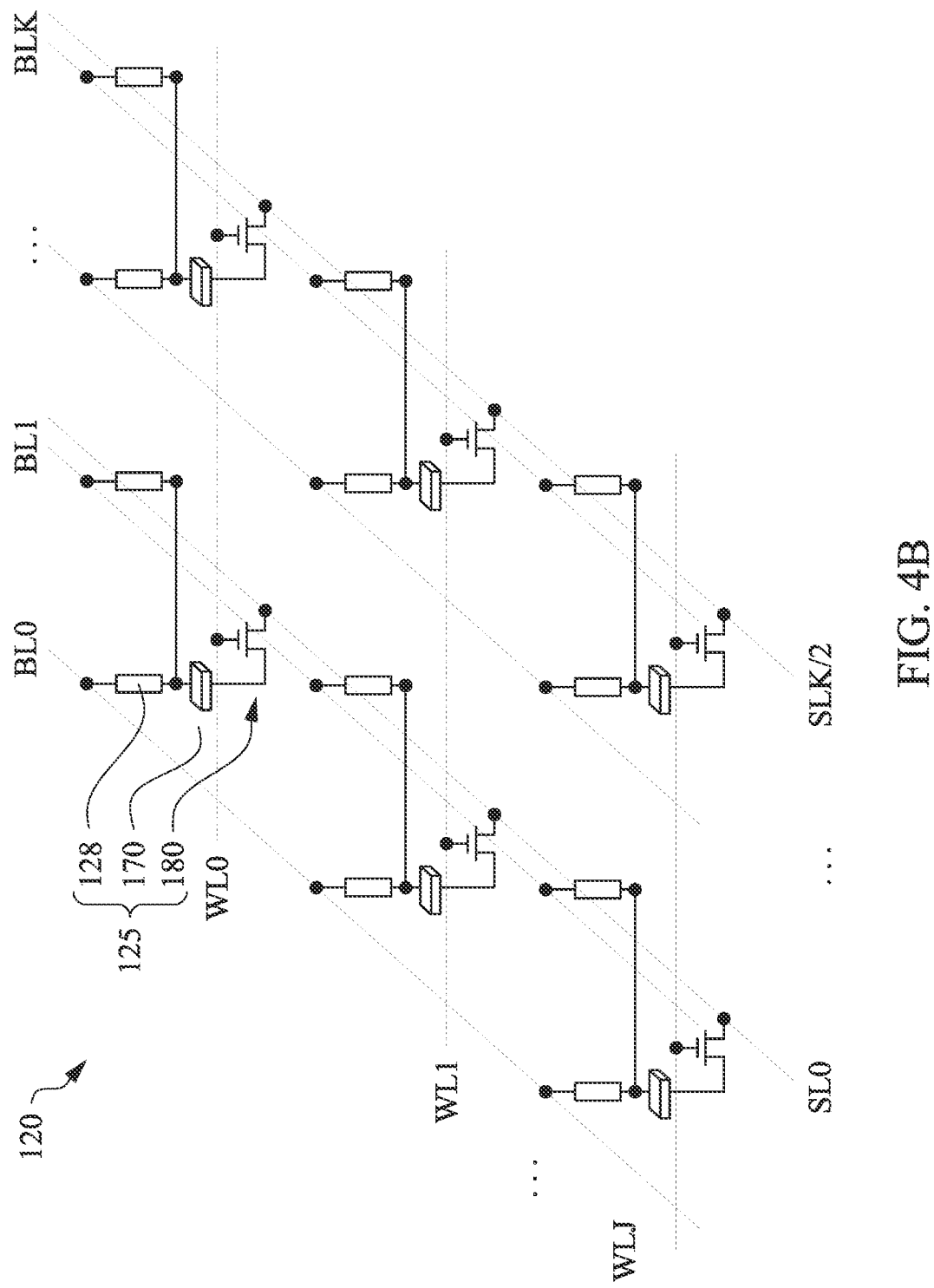

FIG. 4B illustrates an alternative embodiment of FIG. 4A. Since the bonding pads 170 often possess a relatively large area, two or more data-storage elements 128 may share one bonding pad 170 to reduce the amount of bonding pads needed and achieve a compact design. In the depicted embodiment, two data-storage elements 128 may share one bonding pad 170 and one control transistor 180. The amounts of the bonding pads and control transistors needed are cut in half, correspondingly. By appropriately biasing a bit line BL and a word line WL, as well as appropriately biasing an adjacent bit line BL, a memory cell 125 at the cross point of the bit line BL and the word line WL can be appropriately selected for reading or writing though the shared source lines (amount also reduced in half).

Figure 5:
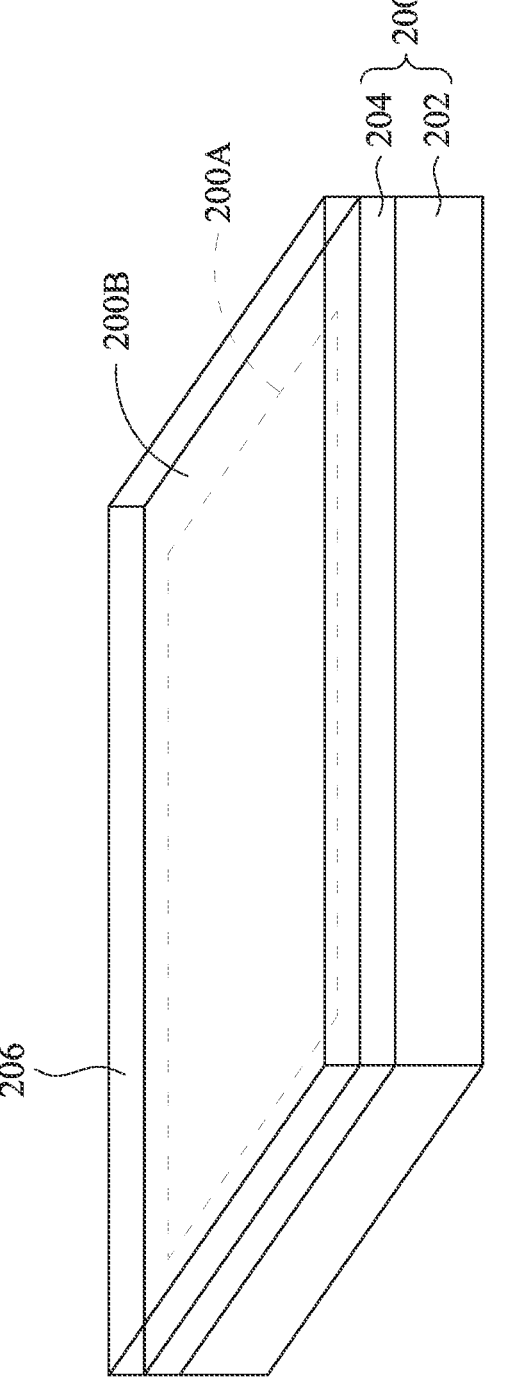
FIGS. 5 and 6 respectively illustrate exemplary integrated circuit components and semiconductor devices including bonded integrated circuit components, according to various aspects of the present disclosure.
Figure 6:
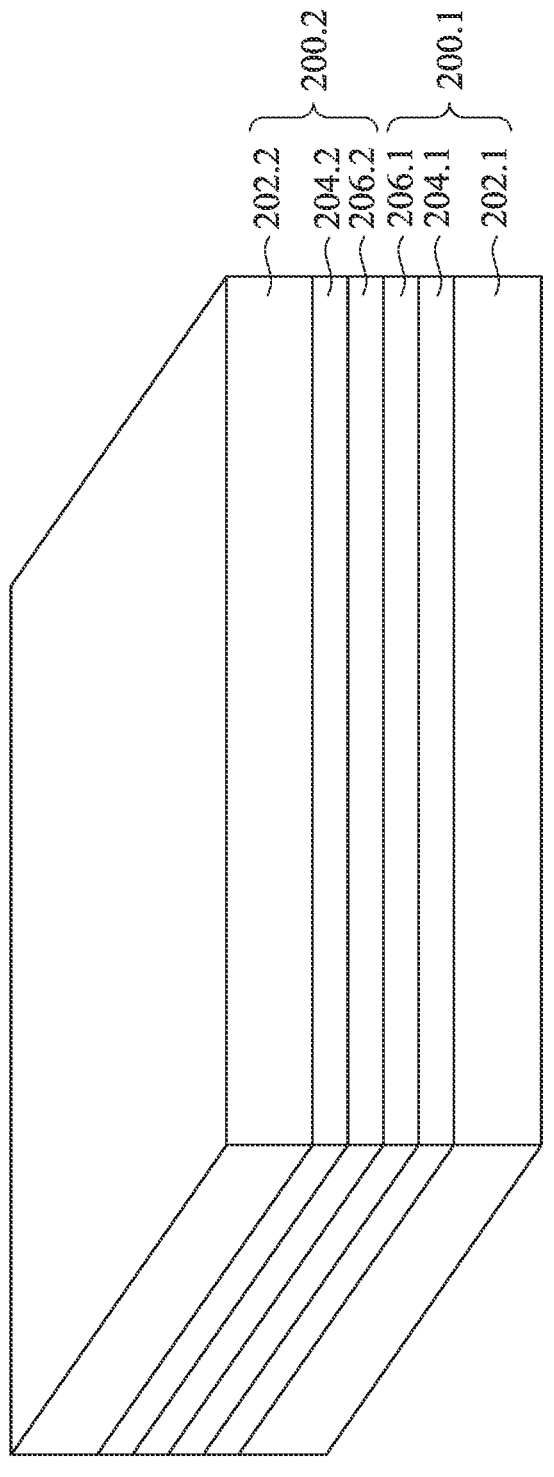

FIGS. 5 and 6 collectively illustrate exemplary bonded integrated circuit components according to exemplary embodiments of the present disclosure. As illustrated in FIG. 5, an exemplary integrated circuit component 200 includes a semiconductor substrate (or substrate) 202 having electronic circuitry formed therein, and an interconnection structure 204 disposed on the semiconductor substrate 202. In some embodiments, the integrated circuit component 200 includes an active region 200A in which the electronic circuitry is formed and a periphery region 200B surrounding the active region 200A. A redistribution layer 206 is fabricated on the interconnection structure 204 of the integrated circuit component 200 in a back-end-of-line (BEOL) process. The redistribution layer 206 formed on the interconnection structure 204 of the integrated circuit component 200 may serve as a bonding layer when the integrated circuit component 200 is bonded with other components. Therefore, the redistribution layer 206 is also referred to as the bonding layer 206. In the exemplary embodiment illustrated in FIG. 5, the electronic circuitry formed in the semiconductor substrate 202 includes analog and/or digital circuitry situated within a semiconductor stack having one or more conductive layers, also referred to as metal layers, interdigitated with one or more non-conductive layers, also referred to as insulation layers. However, one skilled in the relevant art(s) will recognize the electronic circuitry may include one or more mechanical and/or electromechanical devices without departing from the spirit and scope of the present disclosure.

The semiconductor substrate 202 may be made of silicon or other semiconductor materials. Alternatively, the semiconductor substrate 202 may include other elementary semiconductor materials such as germanium. In some embodiments, the semiconductor substrate 202 is made of a compound semiconductor such as sapphire, silicon carbide, gallium arsenic, indium arsenide, or indium phosphide. In some embodiments, the semiconductor substrate 202 is made of an alloy semiconductor such as silicon germanium, silicon germanium carbide, gallium arsenic phosphide, or gallium indium phosphide. In some embodiments, the semiconductor substrate 202 includes an epitaxial layer. For example, the semiconductor substrate 202 has an epitaxial layer overlying a bulk semiconductor.

The semiconductor substrate 202 may further include isolation features (not shown), such as shallow trench isolation (STI) features or local oxidation of silicon (LOCOS) features. Isolation features may define and isolate various semiconductor elements. The semiconductor substrate 202 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 202, in a P-well structure, in an N-well structure, or in a dual-well structure.

The electronic circuitry including the above-mentioned isolation features and semiconductor elements (e.g., transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements) may be formed over the semiconductor substrate 102. Various processes may be performed to form the isolation features and semiconductor elements, such as deposition, etching, implantation, photolithography, annealing, and/or other applicable processes. In some embodiments, the electronic circuitry including the isolation features and semiconductor elements are formed in the semiconductor substrate 202 in a front-end-of-line (FEOL) process.

In some embodiments, the interconnection structure 204 includes dielectric layers, conductive vias embedded in the dielectric layers, and conductive wirings formed between the dielectric layers. Different layers of the conductive wirings are electrically connected to one another through the conductive vias. Furthermore, the interconnection structure 204 is electrically connected to the electronic circuitry formed in the semiconductor substrate 202. In some embodiments, at least one seal ring and at least one alignment mark are formed in the interconnection structure 204, with the seal ring and the alignment mark being formed within the periphery region 200B of the integrated circuit component 200. In some instances, the seal ring surrounds the active region 200A of the integrated circuit component 200, and the alignment mark is formed within a region outside of the seal ring. In some embodiments, pluralities of alignment marks are formed around corners of the integrated circuit component 200. The number of the above-mentioned seal ring and alignment mark(s) is not limited in this disclosure.

In the exemplary embodiment illustrated in FIG. 5, the redistribution layer 206 represents a conductive layer (e.g., a metal layer) from among the one or more conductive layers of the semiconductor stack which is utilized for electrically coupling the electronic circuitry to other electrical, mechanical, and/or electromechanical devices. For example, the redistribution layer 206 may be used to electrically couple the electronic circuitry to an integrated circuit package, such as a through-hole package, a surface mount package, a pin grid array package, a flat package, a small outline package, a chip-scale package, and/or a ball grid array to provide some examples.

As another example and as illustrated in FIG. 6, a semiconductor device includes a first integrated circuit component 200.1, a first redistribution layer 206.1, a second integrated circuit component 200.2 and a second redistribution layer 206.2. The first redistribution layer 206.1 and the second redistribution layer 206.2 are between the first integrated circuit component 200.1 and the second integrated circuit component 200.2. An exemplary first integrated circuit component 200.1 includes a first semiconductor substrate 202.1 having first electronic circuitry formed therein, and a first interconnection structure 204.1 disposed on the first semiconductor substrate 202.1. An exemplary second integrated circuit component 200.2 includes a second semiconductor substrate 202.2 having second electronic circuitry formed therein, and a second interconnection structure 204.2 disposed on the semiconductor substrate 202.2. The first redistribution layer 206.1 from among a first semiconductor stack associated with first electronic circuitry may be electrically and/or mechanically coupled to the second redistribution layer 206.2 from among a second semiconductor stack associated with second electronic circuitry to electrically couple the first electronic circuitry and the second electronic circuitry. In this exemplary embodiment, the first redistribution layer 206.1 is configured and arranged to be electrically and/or mechanically coupled to the second redistribution layer 206.2. In an exemplary embodiment, the first redistribution layer 206.1 is bonded to the second redistribution layer 206.2 using hybrid bonding techniques. In this exemplary embodiment, the hybrid bonding techniques utilize a bonding wave to electrically and/or mechanically couple the first redistribution layer 206.1 and the second redistribution layer 206.2. The term "hybrid bonding" derives from a combination of metal-to-metal bond and insulator-to-insulator (or dielectric-to-dielectric) bond during the bonding process. In some instances, the redistribution layers 206.1 and 206.2 include conducive features for a metal-to-metal bond and dielectric features for an insulator-to-insulator bond, and the bonding wave joins dielectric surfaces that also have metal interconnects to be joined together in the same planar bonding interface. Accordingly, the redistribution layers 206.1 and 206.2 may also be referred to as bonding layers 206.1 and 206.2 (or hybrid bonding layers 206.1 and 206.2). As to be described in further detail below, the first redistribution layer 206.1 and the second redistribution layer 206.2 are configured and arranged to increase balance in bonding wave propagation paths (e.g., along the X-direction and the Y-direction) in promoting symmetric bonding wave propagation between the first redistribution layer 206.1 and the second redistribution layer 206.2 during the bonding, which effectively reduces wafer distortion after the bonding. Notably, those killed in the relevant art(s) would recognize the spirit and scope of the present disclosure can also be applied to other well-known bonding techniques, including but not limiting to direct bonding, surface activated bonding, plasma activated bonding, anodic bonding, eutectic bonding, thermocompression bonding, reactive bonding, and transient liquid phase diffusion bonding.

Figure 7:
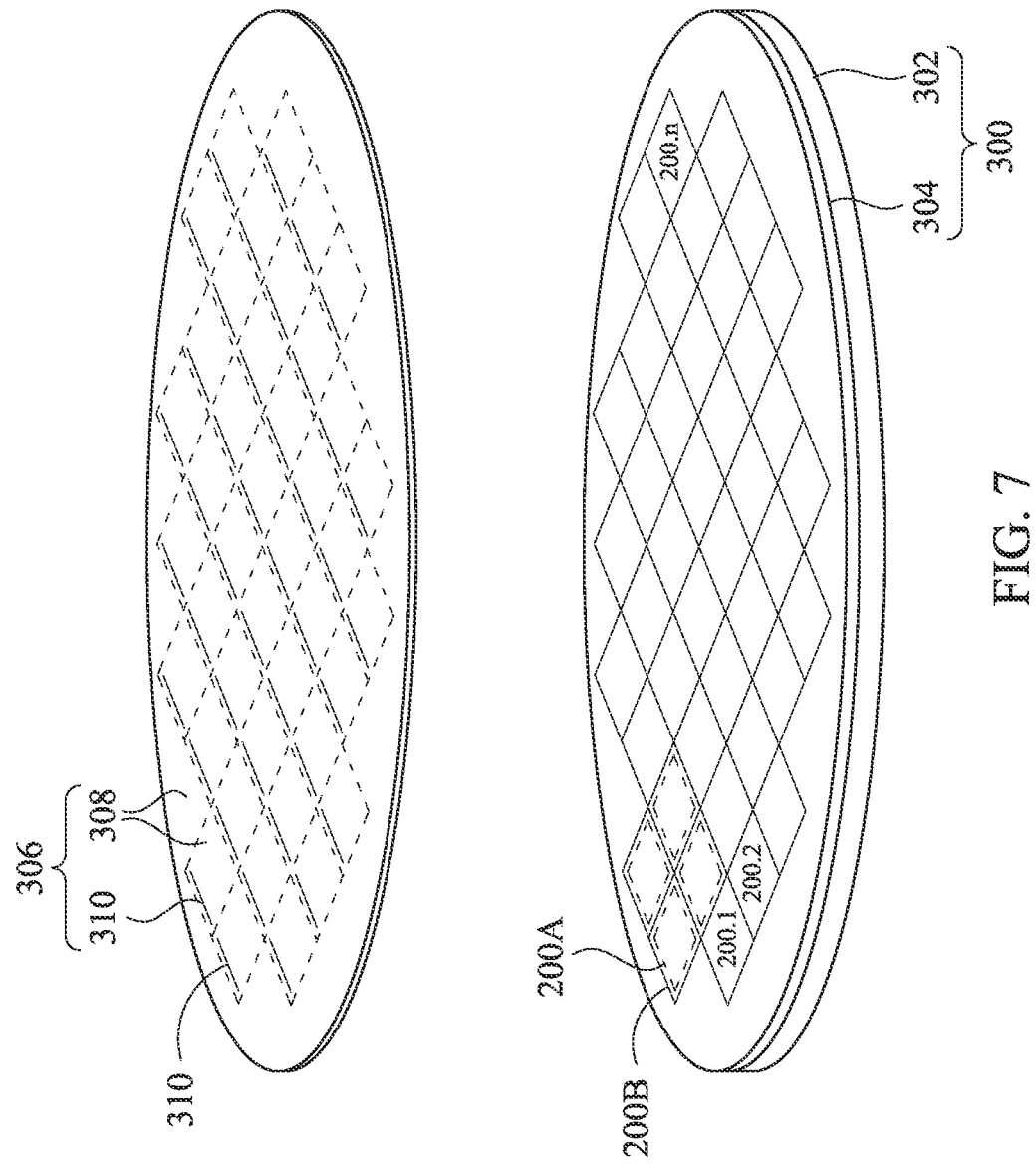
FIGS. 7, 8, and 9 illustrate exemplary semiconductor wafers including the exemplary integrated circuit components according to exemplary embodiments of the present disclosure.
Figure 8:
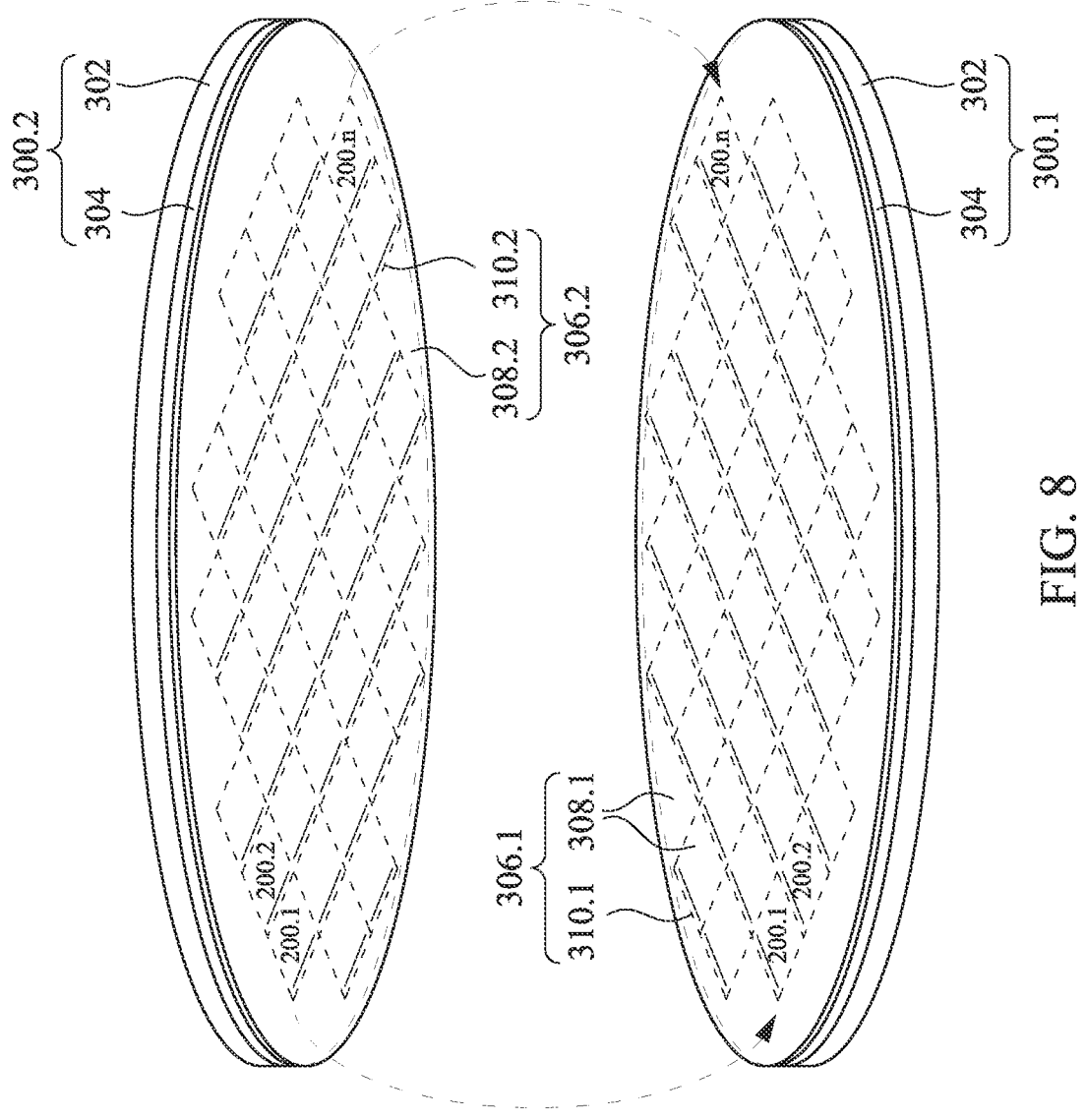
Figure 9:
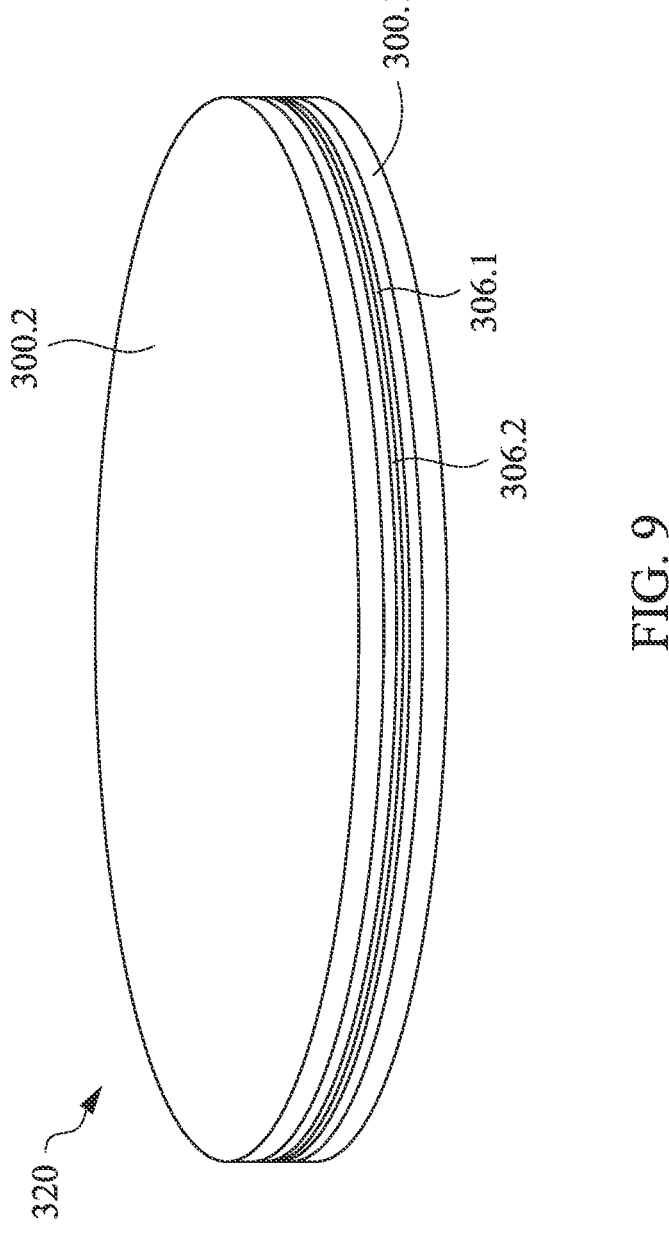

FIGS. 7, 8, and 9 illustrate exemplary semiconductor wafers including the exemplary integrated circuit components according to exemplary embodiments of the present disclosure. Referring to FIG. 7, a semiconductor device fabrication operation is utilized to manufacture multiple integrated circuit components 200.1 through 200.n in a semiconductor wafer 300. The semiconductor wafer 300 includes multiple integrated circuit components 200.1 through 200.n arranged in array. In some embodiments, the semiconductor wafer 300 includes a semiconductor substrate 302 having electronic circuitry formed therein and an interconnection structure 304 disposed on the semiconductor substrate 302. In some embodiments, each one of the integrated circuit component 200.1 through 200.n included in the semiconductor wafer 300 includes an active region 200A having electronic circuitry formed therein and a periphery region 200B surrounding the active region 200A. The semiconductor device fabrication operation uses a predetermined sequence of photographic and chemical processing operations to form the multiple integrated circuit components 200.1 through 200.n in the first semiconductor wafer 300.

In the exemplary embodiment illustrated in FIG. 7, the integrated circuit components 200.1 through 200.n are formed in and/or on the semiconductor substrate 302 using a first series of fabrication operations, referred to as front-end-of-line processing, and a second series of fabrication operations, referred to as back-end-of-line processing. The front-end-of-line processing represents a series of photographic and chemical processing operations to form corresponding electronic circuitry of the multiple integrated circuit components 200.1 through 200.n in and/or on the semiconductor substrate 302. The back-end-of-line processing represents another series of photographic and chemical processing operations to form corresponding interconnection structure 204 of the multiple integrated circuit components 200.1 through 200.n on the semiconductor substrate 302 to form the semiconductor wafer 300. In an exemplary embodiment, the integrated circuit components 200.1 through 200.n included in the semiconductor wafer 300 may be similar and/or dissimilar to one other.

As shown in FIG. 7, the semiconductor substrate 302 is a portion of the semiconductor wafer 300. The semiconductor substrate 302 may be made of silicon or other semiconductor materials. Additionally, the semiconductor substrate 302 may include other elementary semiconductor materials such as germanium. In some embodiments, the semiconductor substrate 302 is made of a compound semiconductor such as silicon carbide, gallium arsenic, indium arsenide, or indium phosphide. In some embodiments, the semiconductor substrate 302 is made of an alloy semiconductor such as sapphire, silicon germanium, silicon germanium carbide, gallium arsenic phosphide, or gallium indium phosphide. In some embodiments, the semiconductor substrate 302 includes an epitaxial layer. For example, the semiconductor substrate 302 has an epitaxial layer overlying a bulk semiconductor. The semiconductor substrate 302 may further include isolation features (not shown), such as shallow trench isolation (STI) features or local oxidation of silicon (LOCOS) features. Isolation features may define and isolate various semiconductor elements. The semiconductor substrate 302 may further include doped regions (not shown). The doped regions may be doped with p-type dopants, such as boron or $BF_2$, and/or n-type dopants, such as phosphorus (P) or arsenic (As). The doped regions may be formed directly on the semiconductor substrate 302, in a P-well structure, in an N-well structure, or in a dual-well structure.

In some embodiments, the interconnection structure 304 includes dielectric layers, conductive vias embedded in the dielectric layers, and conductive wirings between the dielectric layers, wherein different layers of the conductive wirings are electrically connected to one another through the conductive vias.

A redistribution layer 306 is formed over the semiconductor wafer 300. In some embodiments, the process for fabricating the redistribution layer 306 over the semiconductor wafer 300 includes: forming a dielectric layer over the semiconductor wafer 300; patterning the dielectric layer to form a plurality of openings in the dielectric layer to expose conductive pads of the semiconductor wafer 300; depositing a conductive material over the semiconductor wafer 300 such that the dielectric layer and the conductive pads exposed by the openings in the dielectric layer are covered by the conductive material, wherein the conductive material not only covers the dielectric layer and the conductive pads, but also covers sidewall surfaces of the openings and completely fill the openings; performing a grinding process (e.g., CMP process) to partially remove an excess portion of conductive material until the top surface of the dielectric layer 308 is exposed so as to form arrays of conductive contacts 310 (e.g., metal vias and/or metal pads) in the dielectric layer 308. The redistribution layer 306 including the dielectric layer 308 and the arrays of conductive contacts 310 may serve as a bonding layer when a wafer level bonding process is performed to bond the semiconductor wafer 300 with another wafer.

As illustrated in FIG. 8, a first semiconductor wafer 300.1 and a second semiconductor wafer 300.2 to be bonded with each other are provided. In some embodiments, two different types of wafers 300.1 and 300.2 are provided. In other words, the integrated circuit components 200.1 through 200.*n* included in the first semiconductor wafer 300.1 and the integrated circuit components 200.1 through 200.*n* included in the second semiconductor wafer 300.2 may have different architectures and perform different functions. For example, the second semiconductor wafer 300.2 is a memory device wafer including a plurality of chips that include memory arrays (e.g., memory array 120 as in FIG. 4A or FIG. 4B) and other FEOL structures and the first semiconductor wafer 300.1 is an application-specific integrated circuit (ASIC) wafer including a plurality of transistors and other FEOL structures. The transistors in the first semiconductor wafer 300.1 correspond to the memory cells (e.g., memory cells 125 as in FIG. 4A or FIG. 4B) in the memory arrays in the second semiconductor wafer 300.2. In furtherance of the embodiments, the second semiconductor wafer 300.2 is free of transistors, allowing the second semiconductor wafer 300.2 to go through excessive heat to achieve higher crystallization quality for the ferroelectric films in the memory cells.

Before bonding the first semiconductor wafer 300.1 and the second semiconductor wafer 300.2, a first redistribution layer 306.1 and a second redistribution layer 306.2 are formed over the first semiconductor wafer 300.1 and second semiconductor wafer 300.2 respectively. The process for forming the first redistribution layer 306.1 and the second redistribution layer 306.2 may be similar with the process for forming the redistribution layer 306 illustrated in FIG. 7.

In some embodiments, the process for fabricating the first redistribution layer 306.1 over the first semiconductor wafer 300.1 includes: forming a first dielectric layer over the first semiconductor wafer 300.1; patterning the first dielectric layer to form a plurality of first openings in the first dielectric layer 308.1 to expose first conductive pads of the first semiconductor wafer 300.1; depositing a first conductive material over the first semiconductor wafer 300.1 such that the first dielectric layer 308.1 and the first conductive pads exposed by the first openings in the first dielectric layer 308.1 are covered by the first conductive material, wherein the first conductive material not only covers the first dielectric layer 308.1 and the first conductive pads, but also covers sidewall surfaces of the first openings and completely fill the first openings; performing a first grinding process (e.g., CMP process) to partially remove an excess portion of first conductive material until the top surface of the first dielectric layer 308.1 is exposed so as to form multiple arrays of conductive contacts 310.1 (e.g., bonding pads 170 as in FIG. 4A) in the first dielectric layer 308.1. In some embodiments, the process for fabricating the second redistribution layer 306.2 over the second semiconductor wafer 300.2 includes: forming a second dielectric layer 308.2 over the second semiconductor wafer 300.2; patterning the second dielectric layer 308.2 to form a plurality of second openings in the second dielectric layer 308.2 to expose second conductive pads of the second semiconductor wafer 300.2; depositing a second conductive material over the second semiconductor wafer 300.2 such that the second dielectric layer 308.2 and the second conductive pads exposed by the second openings are covered by the second conductive material, wherein the second conductive material not only covers the second dielectric layer 308.2 and the second conductive pads, but also covers sidewall surfaces of the second openings and completely fill the second openings; performing a second grinding process (e.g., CMP process) to partially remove an excess portion of second conductive material until the top surface of the second dielectric layer 308.2 is exposed so as to form multiple arrays of conductive contacts 310.2 (e.g., bonding pads 170 as in FIG. 4A) in the second dielectric layer 308.2.

In some embodiments, the arrays of conductive contacts 310.1 slightly protrude from the top surface of the first dielectric layer 308.1 and the arrays of conductive contacts 310.2 slightly protrude from the top surface of the second dielectric layer 308.2 because the first and second dielectric layers 308.1 and 308.2 are polished at a relatively higher polishing rate while the conductive material is polished at a relatively lower polishing rate during the CMP processes.

As illustrated in FIGS. 8 and 9, after the first and second redistribution layers 306.1 and 306.2 are formed over the first and second semiconductor wafers 300.1 and 300.2, the second semiconductor wafer 300.2 having the second redistribution layer 306.2 formed thereon is flipped onto the first redistribution layer 306.1 formed on the first semiconductor wafer 300.1 such that the multiple arrays of conductive contacts 310.1 of the first redistribution layer 306.1 are substantially aligned with the multiple arrays of conductive contacts 310.2 of the second redistribution layer 206.2. Then, the first semiconductor wafer 300.1 is bonded to the second semiconductor wafer 300.2 through the first and second redistribution layers 306.1 and 306.2 to form a semiconductor device 320. In some embodiments, the bonding interface between the first redistribution layer 306.1 and the second redistribution layer 306.2 in the bonded structure (e.g., the semiconductor device) 320 is substantially misalignment free after performing the bonding process. This bonding may include hybrid bonding, direct bonding, surface activated bonding, plasma activated bonding, anodic bonding, eutectic bonding, thermo-compression bonding, reactive bonding, transient liquid phase diffusion bonding and/or any other well-known bonding technique which is apparent to those skilled in the relevant art(s) without departing from the spirit and scope of the present disclosure. Subsequently, the bonded structure 320 is diced into individual chips.

Illustrated in FIG. 10 is a method 400 of semiconductor fabrication including fabrication of a ferroelectric memory device. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 11-26, which represent cross-sectional views of an embodiment of a memory device according to various stages of the method 400, in accordance with some embodiments of the present disclosure.

The method 400 at operation 402 (FIG. 10) provides (or is provided with) a device structure 500 that includes a substrate 502, such as shown in FIG. 11. The depicted device structure 500 may be a portion of a first wafer. The device structure 500 together with the device structure 600 (to be discussed later on) would be bonded together to form a portion of an IC chip, a system on chip (SoC), or portion thereof, which may include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In furtherance of some embodiments, the device structure 500 is a portion of the upper integrated circuit component 200.2 (FIG. 6).

The substrate 502 may be substantially similar to the substrate 132 (e.g., FIG. 2) and/or the substrate 202 (e.g., FIG. 5) discussed above. Optionally, a doped region (not shown) similar to the doped region 146 (e.g., FIG. 3B) may be formed in the substrate 502. The doped region has a doping type that is opposite to that of the substrate 502. The doped region may be formed with a doping concentration higher than the substrate 502. In some embodiments, the doped region may be formed by a suitable process such as a POC13 doping method or other doping methods.

The method 400 at operation 404 (FIG. 10) forms trenches 504 in the substrate 502, such as shown in FIG. 12. In some embodiments, the trenches 504 has a width W1 and a depth D1, and the aspect ratio of the depth D1 to the width W1 is approximately from about 5 to about 30. The trenches 504 are formed where a trench mask (not shown) is disposed over the substrate 502. The trench mask can be a photoresist mask or a hard mask, such as a nitride. Then, an etching operation is performed with the trench mask in place. The trenches 504 is formed by a suitable etching process, such as a dry etch operation. In some embodiments, the dry etch in the present operation includes a reactive ion etch (RIE) adopting fluorine-containing gases. The trench mask is removed after the trenches 504 are formed.

The method 400 at operation 406 (FIG. 10) deposits a bottom electrode layer 506, such as shown in FIG. 13. In some embodiments, the bottom electrode layer 506 is blanket deposited over the device structure 500 including on sidewalls and bottom surface of the trenches 504. The material composition of the bottom electrode layer 506 may be substantially similar to the bottom electrode 134 (e.g., FIG. 2) discussed above. In some embodiments, the bottom electrode layer 506 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), alloys thereof, or the like. In some embodiments, the bottom electrode layer 506 may be formed of TiN, Ru, W, Mo, TaN, or the like. The bottom electrode layer 506 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. A thickness of the bottom electrode layer 506 may be in a range from 10 nm to 100 nm, although lesser and greater thicknesses may also be used.

Figures 14, 15:
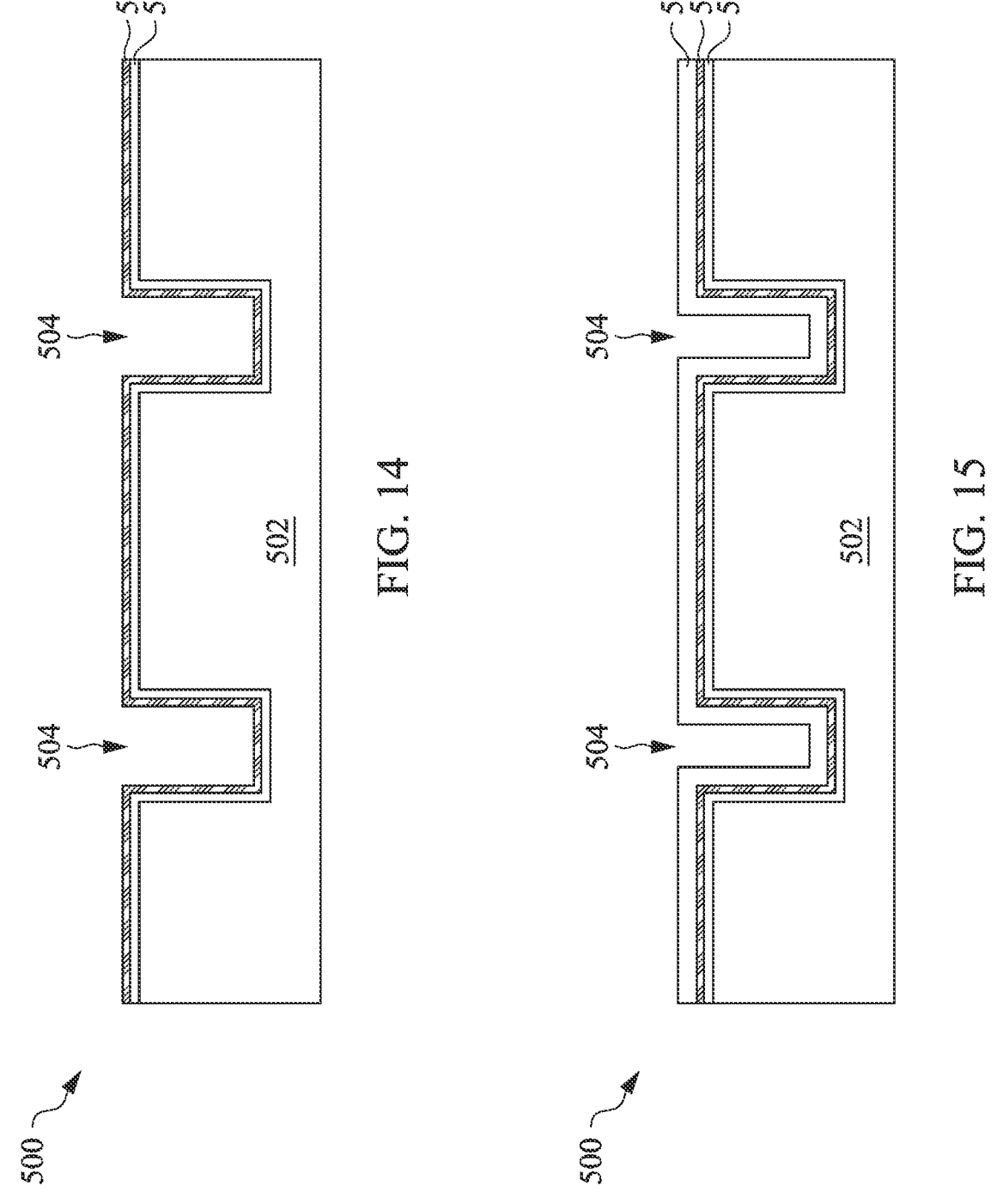

The method 400 at operation 408 (FIG. 10) deposits an interfacial layer 508, such as shown in FIG. 14. In some embodiments, the interfacial layer 508 is blanket deposited over the device structure 500 including on sidewalls and bottom surface of the trenches 504. The material composition of the interfacial layer 508 may be substantially similar to the interfacial layer 136 (e.g., FIG. 2) discussed above. The interfacial layer 508 may include a high-k dielectric material having a dielectric constant greater than 3.9 and may include, but are not limited to, silicon nitride (SiNx), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$) (HZO)), tantalum oxide ($Ta_2O_5$), aluminum oxide ($Al_2O_3$), lanthanum aluminate ($LaAlO_3$), hafnium dioxide-alumina ($HfO_2$—

$Al_2O_3$), zirconium oxide ($ZrO_2$), magnesium oxide (MgO), combinations thereof, or the like. Other suitable dielectric materials are within the scope of the present disclosure. The interfacial layer 508 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. A thickness of the interfacial layer 508 may be less than about 2 nm.

The method 400 at operation 410 (FIG. 10) deposits a ferroelectric film 510, such as shown in FIG. 15. Prior to the deposition of the ferroelectric film 510, a seed structure (not shown) substantially similar to the seed structure 138 (e.g., FIG. 2) discussed above may optionally be formed on the top surfaces of the interfacial layer 508. The seed structure may be a discontinuous layer of metal particles, which may include discrete metal atoms or discrete metal nanoparticles. The seed structure may be a discontinuous layer, such that the seed structure does not form an electrically conductive path on the surface of the interfacial layer 508. The seed structure may have thickness, and/or seed metal particles may have an average particle size, ranging from about 1 Å (angstrom) to about 20 Å, such as from about 1 Å to about 10 Å, or from about 1 Å to about 5 Å. The seed structure may be formed by depositing a seed metal using any suitable deposition process. For example, the seed structure may be formed using physical vapor deposition (PVD), chemical vapor deposition (CVD), atomic layer deposition (ALD), or the like.

In some embodiments, the ferroelectric film 510 is blanket deposited over the device structure 500 including on sidewalls and bottom surface of the trenches 504. The material composition of the ferroelectric film 510 may be substantially similar to the ferroelectric film 140 (e.g., FIG. 2) discussed above. The ferroelectric film 510 includes a ferroelectric material (polarization material). The ferroelectric film 510 may be a single layer or a multi-layer structure, such as a first ferroelectric layer disposed over a second ferroelectric layer, wherein the first ferroelectric layer and the second ferroelectric layer have different compositions. The ferroelectric material can be a high-k dielectric material, such as a dielectric material having a dielectric constant (k) greater than about 28 (e.g., k≥28), having an orthorhombic crystal structure. In some embodiments, the ferroelectric film 510 includes a metal oxide material or a metal oxynitride material. For example, the ferroelectric film 510 may include a hafnium oxide-based material or a zirconium oxide-based material. In furtherance of the example, the ferroelectric film 510 can include hafnium oxide (e.g., $Hf_xO_y$), hafnium zirconium oxide (e.g., $Hf_xZr_zO_y$) (also referred to as HZO), hafnium aluminum oxide (e.g., $Hf_xAl_zO_y$), hafnium lanthanum oxide (e.g., $Hf_xLa_zO_y$), hafnium cerium oxide (e.g., $Hf_xCe_zO_y$), hafnium silicon oxide ($Hf_xSiO_y$), hafnium gadolinium oxide (e.g., $Hf_xGd_zO_y$), other suitable $Hf_xO_y$-based material, or combinations thereof, where x, y, z are atom percentages. In another example, the ferroelectric film 510 can include a $Zr_jO_k$-based material, where j, k, z are atom percentages. The ferroelectric film 510 may be formed by depositing a ferroelectric material using any suitable deposition method, such as PVD, spin coating and annealing, sputtering, CVD, ALD, plasma-enhanced chemical vapor deposition (PECVD), spray pyrolysis, pulsed laser deposition (PLD) or combinations thereof. During the deposition process, the seed metal may promote the growth of a desired crystal phase in the ferroelectric film 510. For example, when the ferroelectric film 510 comprises a Hf-based ferroelectric material, the primary crystal phase of the ferroelectric film 510 may have an orthorhombic crystal structure. If the ferroelectric film 510 comprises a Pb-based material, such as PBT or PZT, the primary crystal phase of the ferroelectric film 510 may have a tetragonal crystal structure. In particular, the primary crystal phase may account for at least 50%, such as from about 60% to about 99.9%, or from about 70% to about 95% of the ferroelectric film 510. In some embodiments, a thickness of the ferroelectric film 510 is less than about 5 nm.

Figures 16, 17:
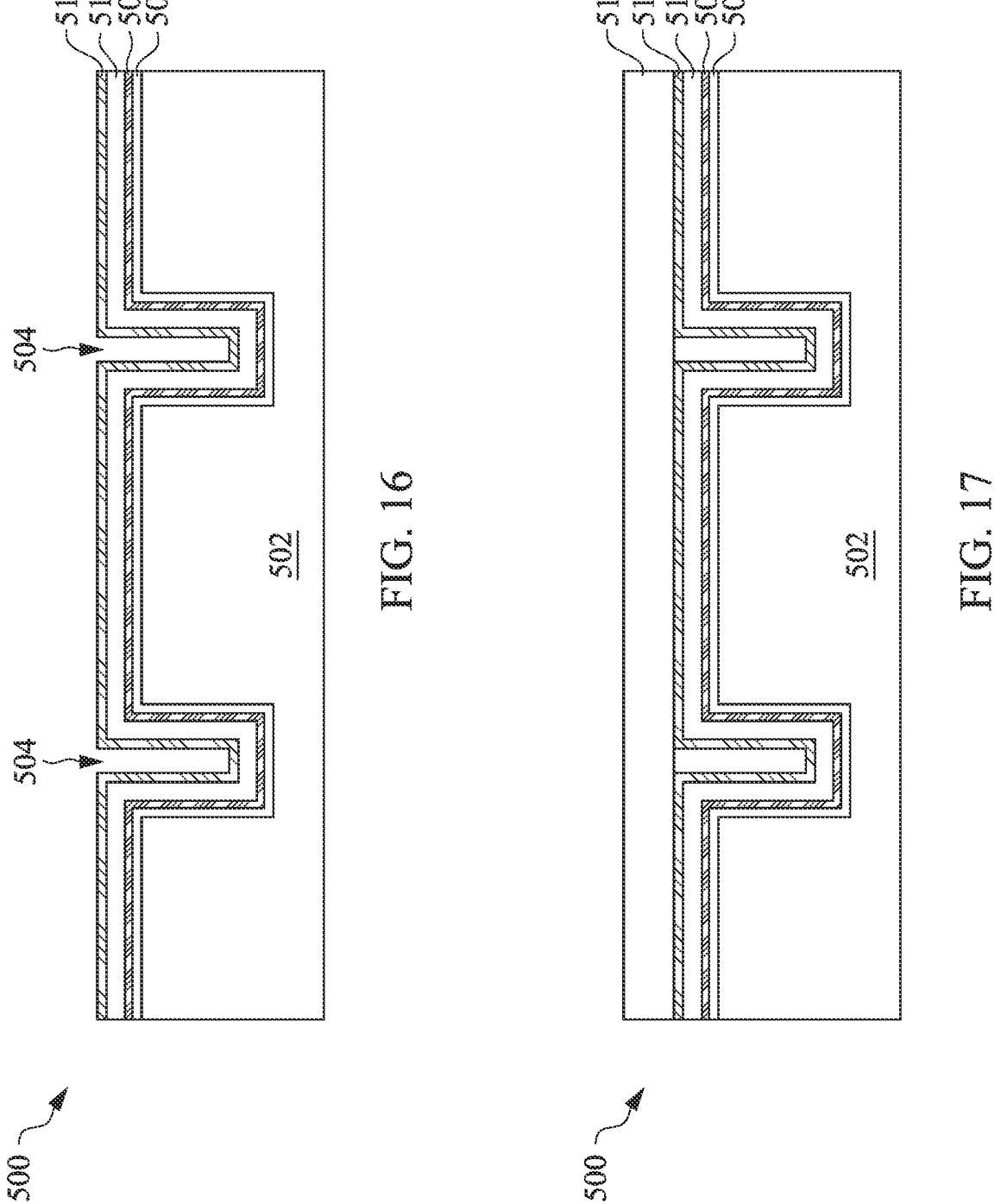

The method 400 at operation 412 (FIG. 10) deposits a top electrode layer 512, such as shown in FIG. 16. In some embodiments, the top electrode layer 512 is blanket deposited over the device structure 500 including on sidewalls and bottom surface of the trenches 504. The material composition of the top electrode layer 512 may be substantially similar to the top electrode 142 (e.g., FIG. 2) discussed above. The top electrode layer 512 may include, and/or may consist essentially of, at least one of a transition metal, a conductive metallic nitride, and a conductive metallic carbide. Exemplary metallic materials that may be used for the top electrode layer 512 include, but are not limited to, TiN, TaN, WN, W, Cu, Al, Ti, Ta, Ru, Co, Mo, Pt, an alloy thereof, and/or a combination thereof. Other suitable materials within the contemplated scope of disclosure may also be used. For example, the top electrode layer 512 may include, and/or may consist essentially of, an elemental metal such as W, Cu, Ti, Ta, Ru, Co, Mo, or Pt. The thickness of the top electrode 512 may be in a range from 10 nm to 100 nm, although lesser and greater thicknesses may also be used.

Figure 18:
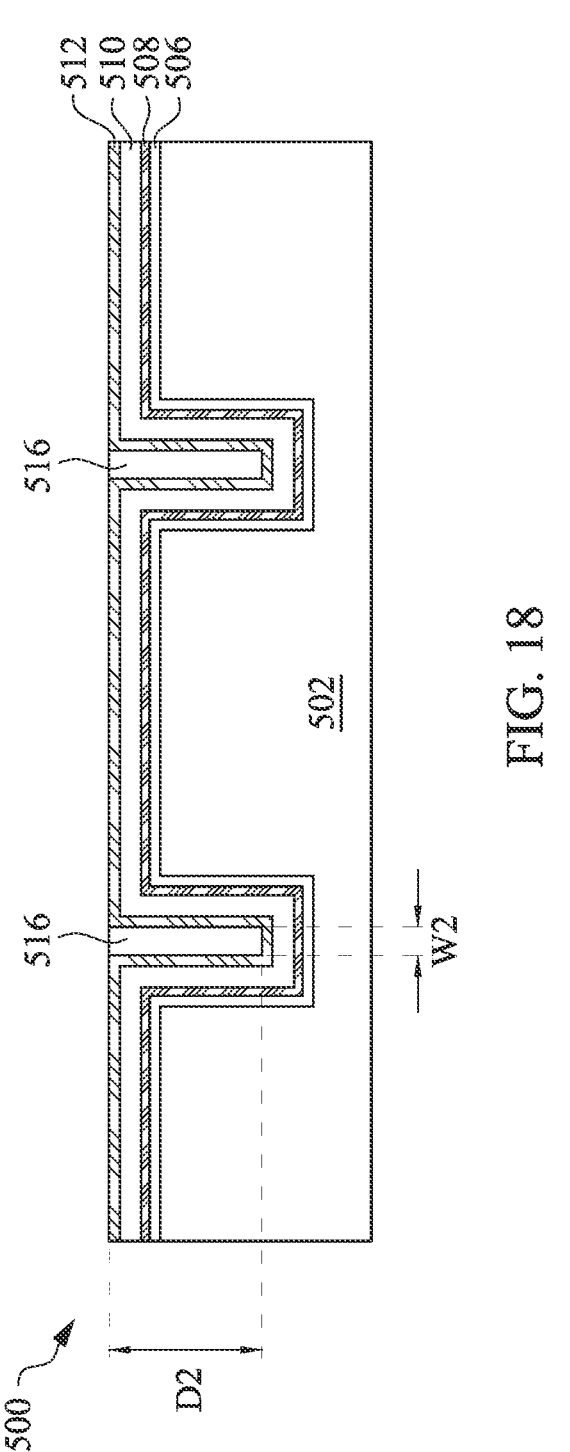

The method 400 at operation 414 (FIG. 10) deposits a plugging layer 514, such as shown in FIG. 17. The plugging layer 514 plugs the remaining openings in the trenches 504. The material composition of the plugging layer 514 may be substantially similar to the plug 148 (e.g., FIG. 3C) discussed above. In some embodiments, the plugging layer 514 includes a dielectric material, such as a high-k dielectric material. Examples of high-k dielectric materials include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. In some embodiments, the plugging layer 514 includes a semiconductor material, such as polysilicon. In some embodiments, the plugging layer 514 includes a conductive material other than the top electrode layer 512, such as copper, aluminum, gold, silver, or tungsten. The plugging layer 514 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. At the conclusion of operation 414, a planarization process (e.g., CMP process) is performed to remove an excess portion of the plugging layer 514 until the top surface of the top electrode layer 512 is exposed so as to form the plugs embedded in the top electrode layer 512. The resultant structure after the planarization process is shown in FIG. 18. The plugs are denoted as plugs 516. The plugs 516 strengthen mechanical strength of the to-be-formed high-aspect ratio FTJs and may further functions as an extension of the top electrode layer 512 if it is formed of semiconductor material or conductive material. A top surface of the plugs 516 may be substantially planar with the top surface of the top electrode layer 512. Alternatively, the top surface of the plugs 516 may have a concave profile and below the top surface of the top electrode layer 512 due to the dishing effect during the planarization process. The aspect ratio of the depth D2 to the width W2 of the plugs 516 ranges from about 30 to about 50, which is larger than the aspect ratio of the trenches 504.

Figure 19:
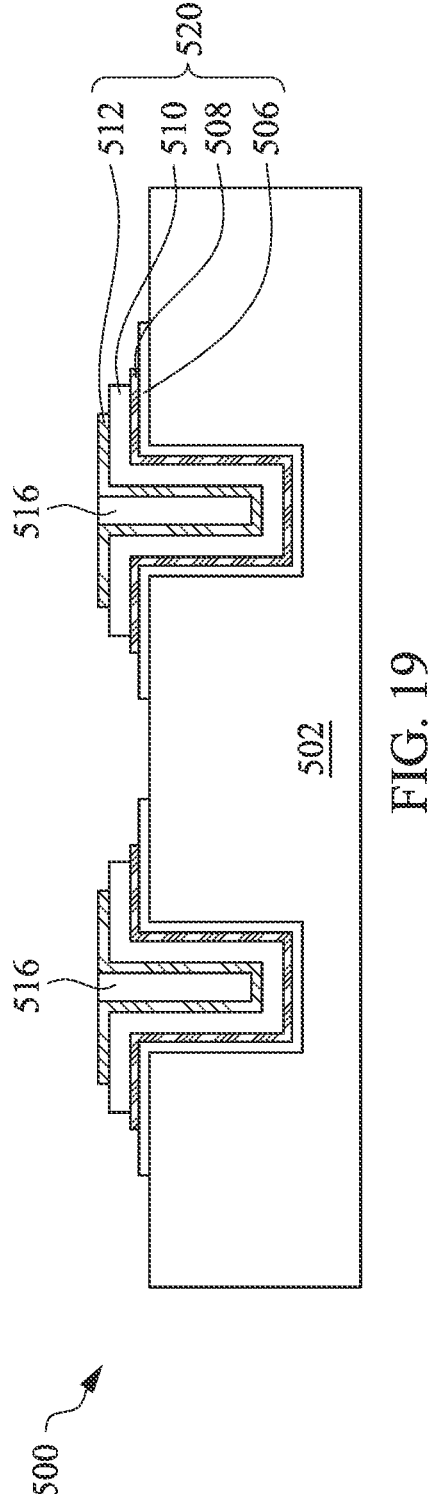

The method 400 at operation 416 (FIG. 10) patterns the top electrode layer 512, the ferroelectric film 510, the interfacial layer 508, the bottom electrode layer 506 to form FTJs 520, such as shown in FIG. 19. The patterned bottom electrode layer 506 and the patterned top electrode layer 512 are denoted as bottom electrode 506 and top electrode 512, respectively, for simplicity. In some embodiments, the patterning of the bottom electrode layer 506 includes depositing a photoresist layer (not shown) over the device structure 500, exposing the photoresist to a pattern, performing post-exposure bake processes, and developing the photoresist to form a masking element. The masking element may then be used to protect regions of the FTJs 520, and layers formed thereupon, while an etch process removes layers from unprotected regions through the openings in the masking element. The etching process may include dry etching, wet etching, RIE, and/or other suitable processes. The patterning of the top electrode layer 512 is performed in sequence through a similar patterning process. The patterning of the top electrode layer 512 exposes a top surface of the bottom electrode 506. In some embodiments, top surfaces of the layers stacked between the top and bottom electrodes remain covered by the top electrode 512, while sidewalls thereof are exposed. In some embodiments, from bottom to top, the sizes of the layers 506, 508, 510, and 512 decrease in sequence, such that each of the layers thereof has a portion of the top surface exposed.

The method 400 at operation 418 (FIG. 10) performs a thermal treatment 524 to the device structure 500, such as shown in FIG. 20. By forming transistors and other FEOL structures in another wafer, as to be explained in further detail later on, excessive thermal temperature can be applied to the device structure 500 without causing damage to the transistors and other FEOL structures. In some embodiments, the wafer that hosts the ferroelectric film 510 can be subject to a thermal treatment with a temperature larger than about 550° C., such as between about 550° C. and about 1000° C. without subjecting the FEOL structures to such excessive heat. Thus, the crystallization quality of the ferroelectric film 510 is increased, and the performance of the ferroelectric memory devices is improved with little or no risk of damaging the FEOL structures. In some embodiments, the ferroelectric film 510 may be annealed using Excimer-laser annealing (ELA), flash lamp annealing (FLA), furnace annealing, or the like. Operationally, the thermal treatment 524 may be performed prior to operation 416, even prior to operation 414, but after operation 412. That is, the crystallization improvement may be performed before the electrode layers, the ferroelectric film, and interfacial layers are patterned into the FTJs 520.

Figure 21:
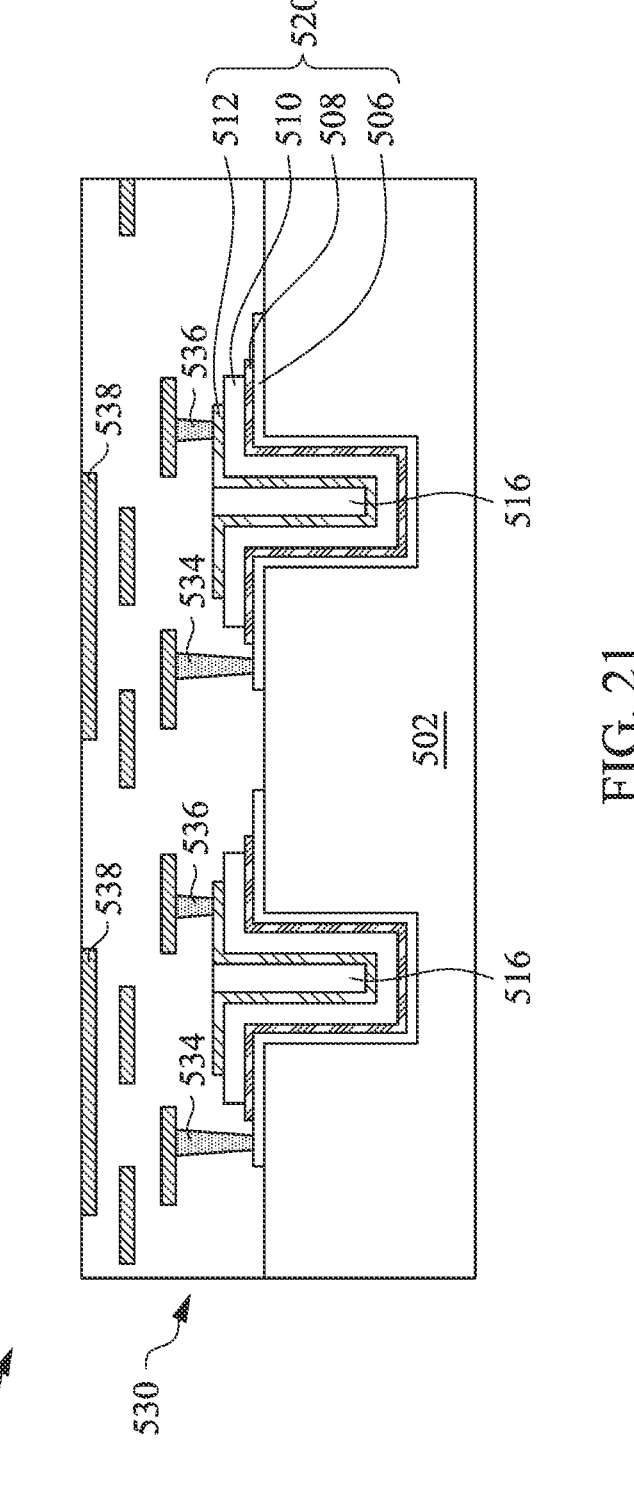

The method 400 at operation 420 (FIG. 10) forms an interconnect structure 530 is formed on the device structure 500, such as shown in FIG. 21. In some embodiments, the interconnect structure 530 may include about two (2) to about five (5) metal layers. Each of the metal layers of the interconnect structures include multiple conductive vias and metal lines embedded in at least one dielectric layer (e.g., interlayer dielectric (ILD) layer and/or intermetal dielectric (IMD) layer). The conductive vias and metal lines may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu). The dielectric layer may be or comprise an oxide, such as silicon dioxide, a low-k dielectric material, another suitable dielectric material, or any combination of the foregoing. In yet further embodiments, the dielectric layer may, for example, be or comprise silicon dioxide, a low-k dielectric material, silicon nitride, silicon carbide, extreme low-k (ELK) dielectric material, another suitable dielectric material, or any combination thereof. The conductive vias and metal lines are embedded or disposed in the dielectric layers. For example, in the depicted embodiment, the conductive vias 534 land on the exposed top surface of the bottom electrodes 506, and the conductive vias 536 land on the top surface of the top electrodes 512. In the depicted embodiment, the conductive vias 536 further electrically couples the top electrodes 512 to the top metal lines 538.

Figure 22:
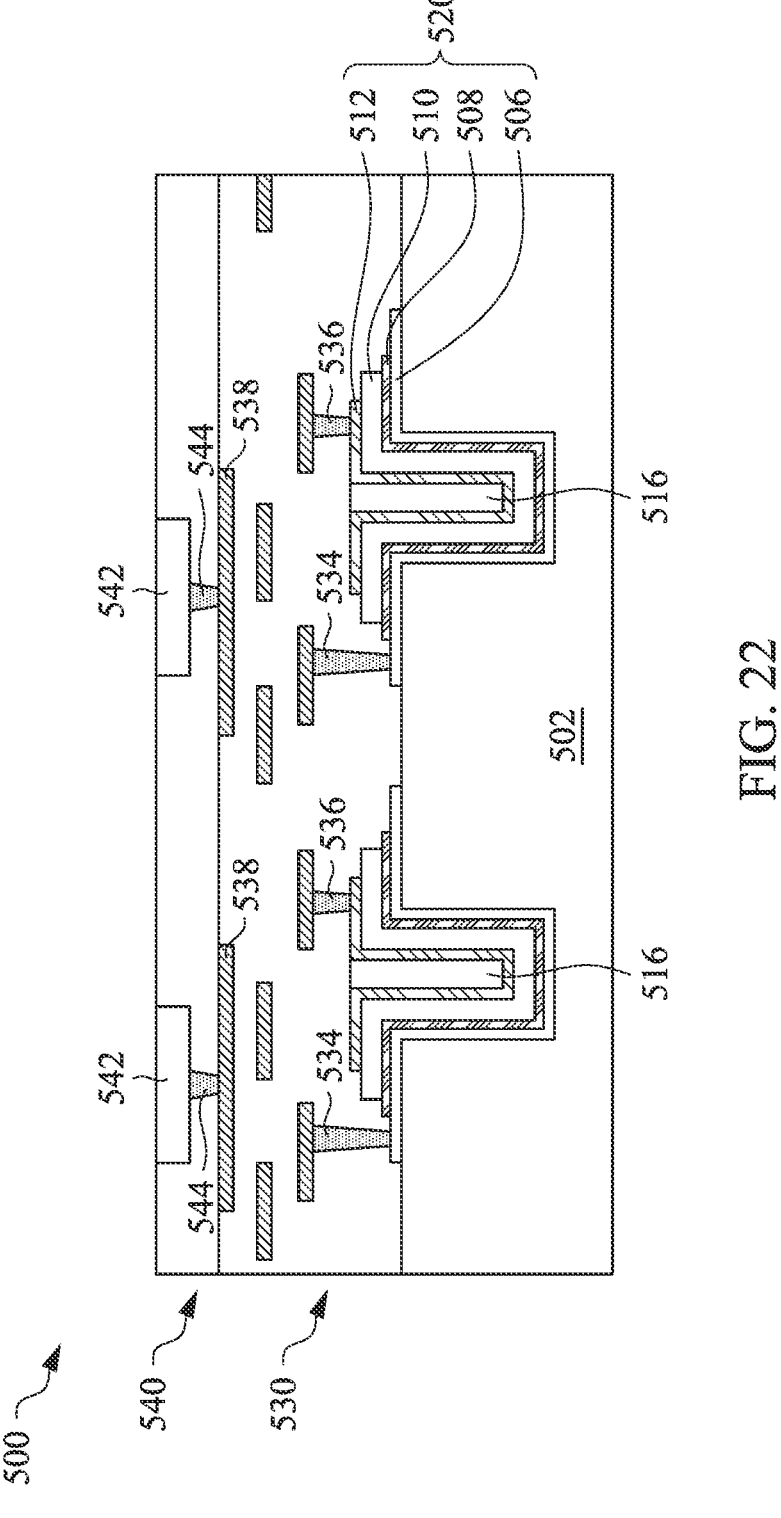

The method 400 at operation 422 (FIG. 10) forms a redistribution layer (or hybrid bonding layer) 540 overlaying the interconnect structure 530, such as shown in FIG. 22. The redistribution layer 540 includes conductive features (e.g., bonding pads 542) for a metal-to-metal bond, and dielectric features for insulator-to-insulator bond. The bonding pads 542 electrically connect to the FTJs 520 through vias 544 embedded in the redistribution layer 540 and the metal wiring (e.g., top metal lines 538) in the interconnect structure 530. In some embodiments, the thermal treatment in operation 418 is performed after operation 422 but prior to operation 426 in which a bonding process is performed.

Figure 23:
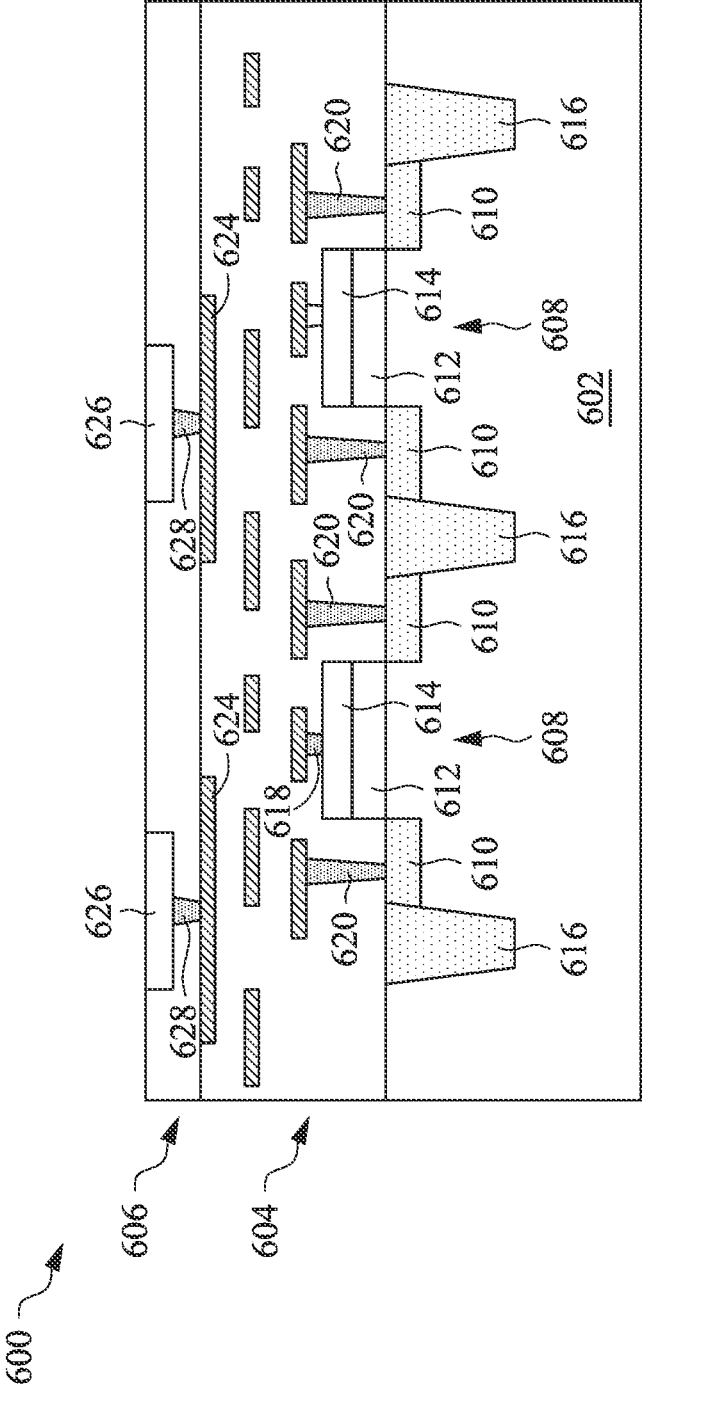

The method 400 at operation 424 (FIG. 10) forms a device structure 600, such as shown in FIG. 23. The depicted device structure 600 may be a portion of a second wafer different from the first wafer. The device structure 600 is simplified and not all features in the device structure 600 are illustrated or described in detail. The device structure 600 together with the device structure 500 discussed above would be bonded together. In furtherance of some embodiments, the device structure 600 is a portion of the lower integrated circuit component 200.1 (FIG. 6).

The device structure 600 includes an interconnect structure 604 overlaying a substrate 602. In an embodiment, the substrate 602 includes silicon (Si). Alternatively or additionally, substrate 602 may include another elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 602 may be a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 602 can include various doped regions (not shown) depending on design requirements of device structure 600. In some implementations, the substrate 602 includes p-type doped regions (for example, p-type wells) doped with p-type dopants, such as boron (for example, $BF_2$), indium, other p-type dopant, or combinations thereof. In some implementations, the substrate 602 includes n-type doped regions (for example, n-type wells) doped with n-type dopants, such as phosphorus (P), arsenic (As), other n-type dopant, or combinations thereof. In some implementations, the substrate 602 includes doped regions formed with a combination of p-type dopants and n-type dopants. The various doped regions can be formed directly on and/or in the substrate 602, for example, providing a p-well structure, an n-well structure, a dual-well structure, a raised structure, or combinations thereof. An ion implantation process, a diffusion process, and/or other suitable doping process can be performed to form the various doped regions.

A plurality of semiconductor devices 608 are disposed within and/or over the substrate 602. In some embodiments, the semiconductor devices 608 may, for example, be configured as transistors or as another suitable semiconductor device. In such embodiments, the semiconductor devices 608 may include corresponding source/drain regions 610, corresponding gate structures 612, and corresponding gate capping layers 614. As used herein, a source/drain region, or "S/D region," may refer to a source or a drain of a device. It may also refer to a region that provides a source and/or drain for multiple devices. In some embodiments, the source/drain regions 610 are disposed within the substrate 602. In further embodiments, the gate structures 612 may include corresponding gate electrodes overlying corresponding gate dielectric layer. In various embodiments, the gate electrodes may, for example, be or comprise a metal (such as aluminum, tungsten, titanium, any combination of the foregoing, or the like), polysilicon, another suitable conductive material, or any combination of the foregoing. In further embodiments, the gate dielectric layers may, for example, be or comprise silicon dioxide, a high-k dielectric material, another suitable dielectric material, or any combination of the foregoing. The gate capping layers 614 are conductive and may, for example, be or comprise tantalum, titanium, a silicide, another suitable material, or any combination of the foregoing. Further, isolation structures 616 are disposed within the substrate 602 and may laterally surround a corresponding semiconductor device 608. In some embodiments, the isolation structures 616 may, for example, be configured as shallow trench isolation (STI) structures, deep trench isolation (DTI) structures, or another suitable isolation structure. In further embodiments, the isolation structures 616 may, for example, be or comprise silicon dioxide, silicon nitride, silicon carbide, another suitable dielectric material, or any combination of the foregoing.

Further, the semiconductor devices 608 may be a planar transistor or a multi-gate transistor, such as a fin-like FET (FinFET) or a gate-all-around (GAA) transistor. A GAA transistor may include channel regions of various shapes including nanowire, nanobar, or nanosheet, which may be collectively referred to as nanostructures. A GAA transistor may also be referred to as a multi-bridge-channel (MBC) transistor or a surrounding-gate-transistor (SGT). While the semiconductor devices 608 is shown as a planar device in FIG. 23 and subsequent figures, it should be understood that the semiconductor devices 608 may as well be FinFETs or GAA transistors.

The interconnect structure 604 includes a lower portion that includes gate contact vias 618 and source/drain contact vias 620 embedded in an interlayer dielectric (ILD) layer. The ILD layers may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. The source/drain contact may include ruthenium (Ru), cobalt (Co), nickel (Ni), or copper (Cu). The gate contact via may include tungsten (W), ruthenium (Ru), cobalt (Co), nickel (Ni), or copper (Cu). The interconnect structure 604 includes an upper portion including multiple metal layers sequentially stack, such as a first metal layer M1 to an nth metal layer Mn (not shown).

Further metal layers of the interconnect structure 604 will be formed over the nth metal layer Mn. In some embodiments, the interconnect structure 604 may include about two (2) to about five (5) metal layers. Each of the metal layers of the interconnect structures include multiple vias and metal lines embedded in at least one intermetal dielectric (IMD) layer. The vias and metal lines may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu). The IMD layer may have a composition similar to that of the ILD layers described above. The vias and metal lines are embedded or disposed in the IMD layers.

The device structure 600 includes a redistribution layer (or hybrid bonding layer) 606 disposed over the interconnect structure 604. The redistribution layer 606 includes conductive features (e.g., bonding pads 626) for a metal-to-metal bond, and dielectric features for insulator-to-insulator bond. The bonding pads 626 electrically connect to the control transistors 608 through vias 628 embedded in the redistribution layer 606 and the metal wiring (e.g., top metal lines 624) in the interconnect structure 604.

Figure 24:
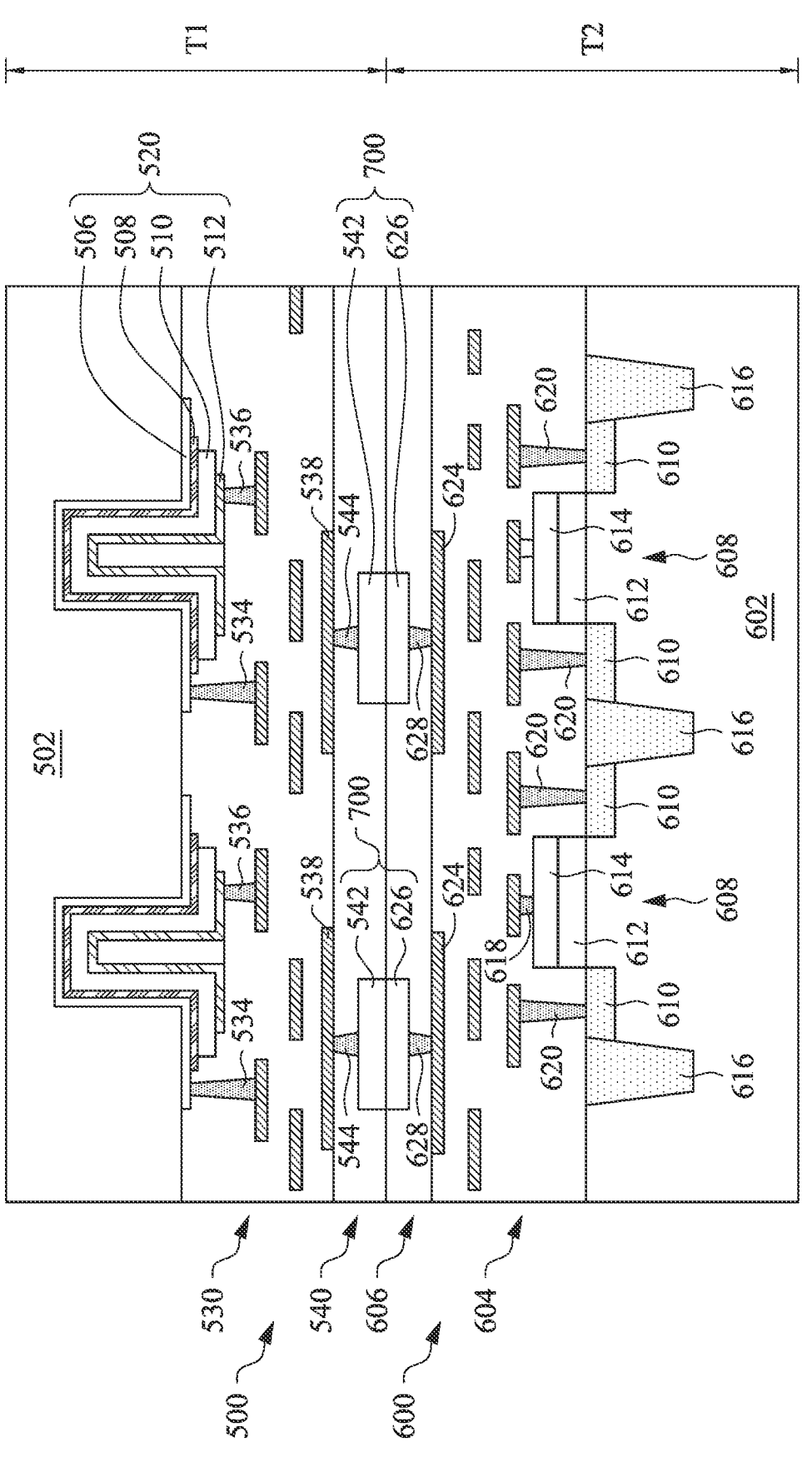

The method 400 at operation 426 (FIG. 10) bonds the device structure 500 with the device structure 600 to form a bonded structure 700. FIG. 24 illustrates the bonded structure 700 after the device structures 500 and 600 are bonded together. The topside (or frontside) of the bonded structure 700 is the bottom side (or backside) of the device structure 500. The bottom side (or backside) of the bonded structure 700 is the bottom side (or backside) of the device structure 600. In the bonded structure 700, the device structure 500 has a thickness T1, and the device structure 600 has a thickness T2 that is generally larger than T1. In some embodiments, T1 is less than about 10 um, and T2 is less than about 700 um. A pair of the bonding pad 542 of the device structure 500 and the bonding pad 626 of the device structure 600 collectively defines a hybrid bonding pad 702. Through the hybrid bonding pad 702, an electrode of an FTJ 520 is electrically coupled to one of the source/drain regions 610 of a corresponding control transistor 608.

Figure 25:
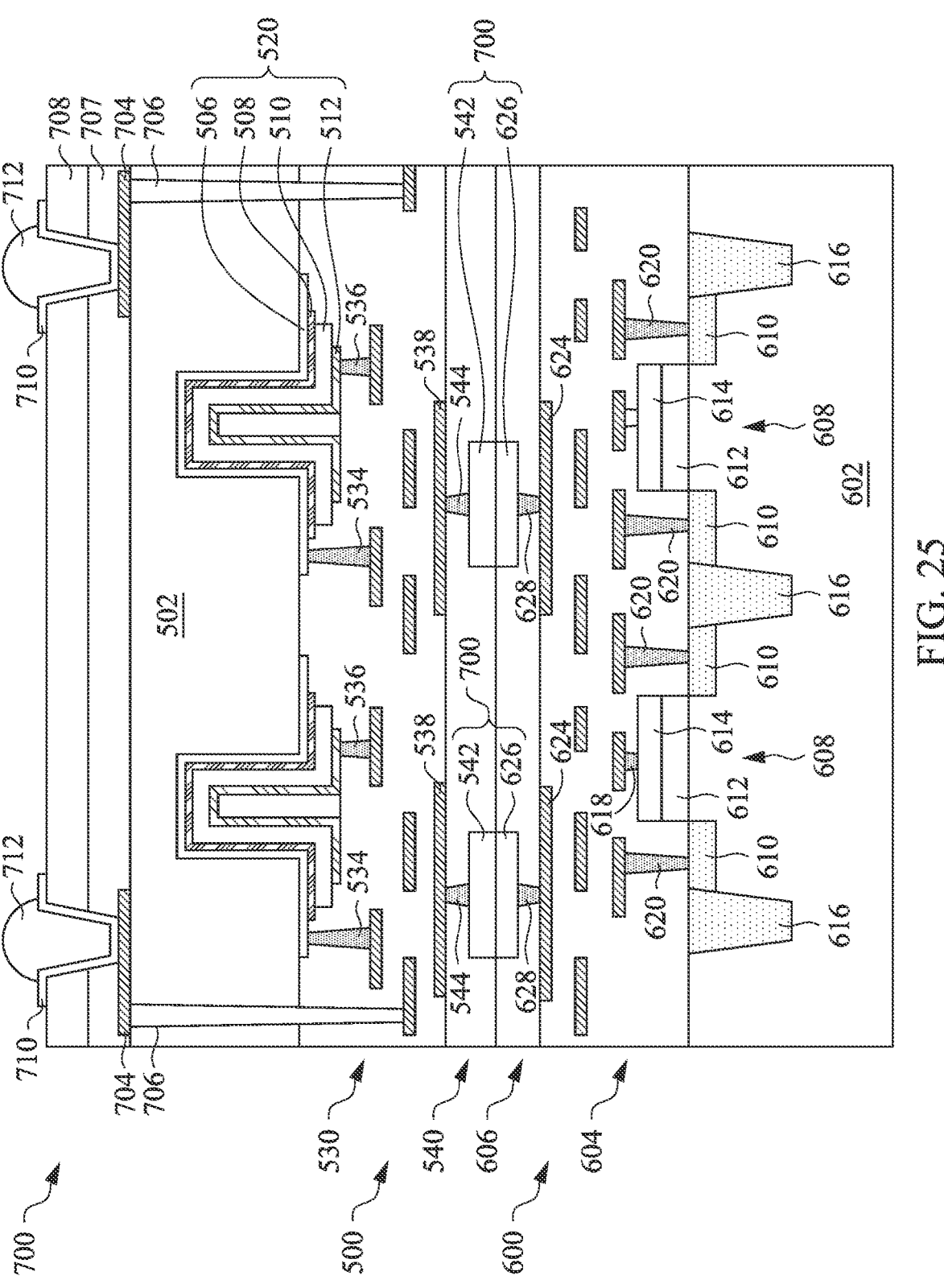

The method 400 at operation 428 (FIG. 10) performs further processing to form various features, such as shown in FIG. 25. In the depicted embodiment, frontside bond pads 704 are arranged along the frontside of the bonded structure 700. Through-substrate-vias (TSVs) 706 extends from the frontside bond pads 704, through the substrate 502, and protrude into the interconnect structure 530. The TSVs 706 have a relatively small size (e.g., less than or equal to approximately 2.5 um) that allows for the TSVs 706 to connect to thin metal lines in the interconnect structure 530. The frontside bond pads 704 are covered by passivation layers 707 and 708. In various embodiments, the passivation layers 707 and 708 may, for example, respectively be or comprise silicon dioxide, silicon oxynitride, silicon oxycarbide, silicon nitride, silicon carbide, another suitable dielectric material, or any combination of the foregoing. An under-bump metallurgy (UBM) layer 710 extends through an opening in the passivation layers 707 and 708 to contact the frontside bond pads 704. In some embodiments, the UBM layer 710 may also extend along an upper surface of the passivation layer 708. Conductive bumps 712 are arranged within the UBM layer 710 at a position that is separated from the passivation layers 707 and 708 by the UBM layer 710. The conductive bump 712 is configured to provide an electrical connection between an electrode of the FTJs 520 and a bit line BL.

Referring to FIGS. 4A and 25 collectively, in some embodiments, it is the top electrode 512 of an FTJ 520 electrically coupled to a source/drain region 610 of a control transistor 608 through a hybrid bonding pad 702, while the bottom electrode 506 is coupled to a bit line BL through a TSV 706. In some alternative embodiments, it is the bottom electrode 506 of an FTJ 520 electrically coupled to a source/drain region of a control transistor 608 through a hybrid bonding pad 702, while the top electrode 512 is coupled to a bit line BL through a TSV 706.

Figure 26:
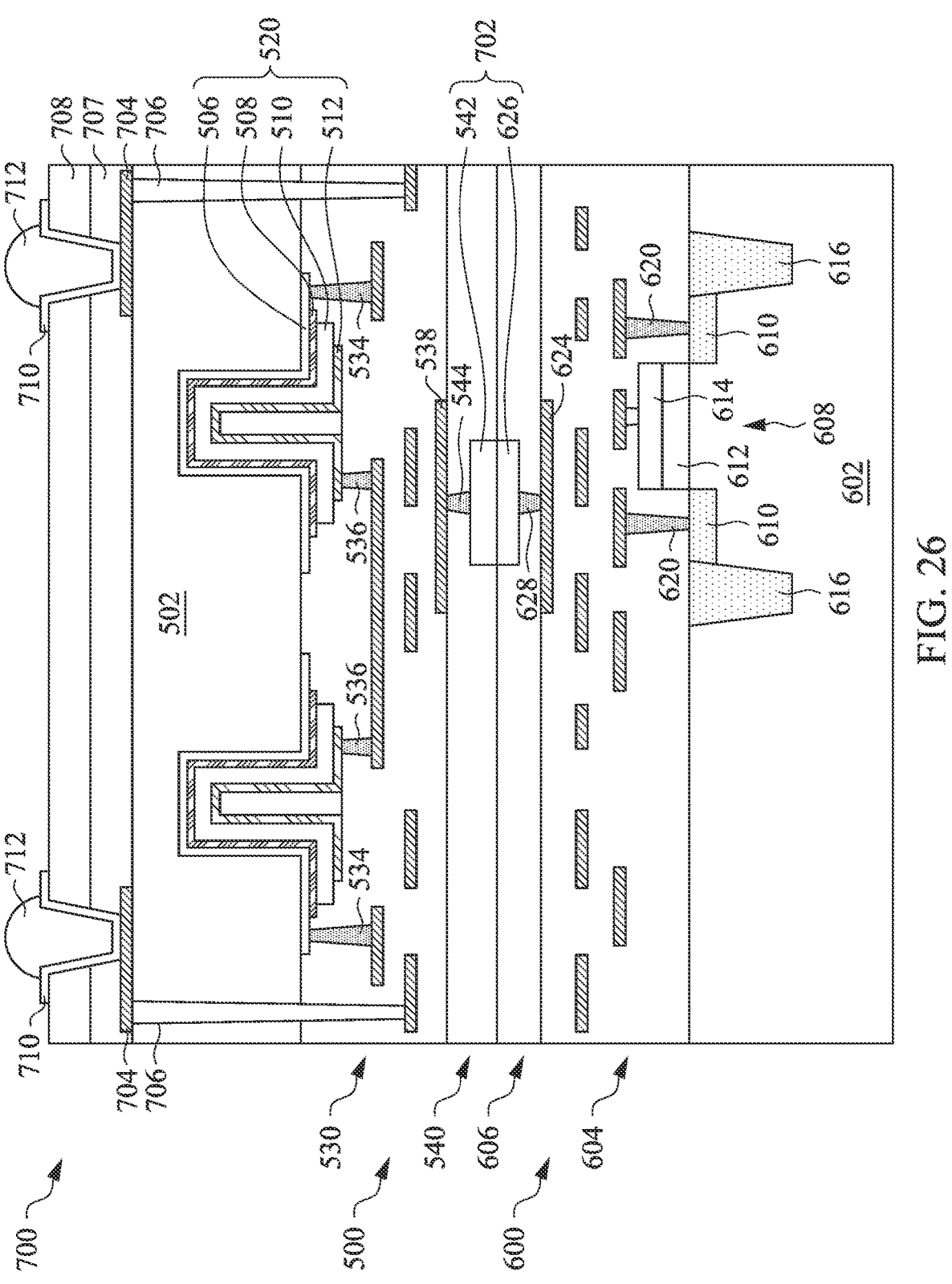

Referring to FIGS. 4B and 26 collectively, in some alternative embodiments, two or more FTJs may share a hybrid bonding pad 702 and a control transistor 608 to reduce amounts needed for hybrid bonding pads and control transistors. Since sizes of the hybrid bonding pads 702 are usually much larger than sizes of control transistors 608 and FTJs 520, a one-to-one mapping of the hybrid bonding pads and individual FTJ requires the same number of hybrid bonding pads as the memory cells in the memory array, which would cost a relatively large device area. As depicted in FIG. 26, the top electrodes 512 of two or more FTJs 520 may be electrically connected to a metal line through conductive vias 536 and further coupled to a shared hybrid bonding pad 702, while the bottom electrodes 506 are electrically coupled to TSVs 706 in a one-to-one mapping. Alternatively, the bottom electrodes 506 of two or more FTJs 520 may be electrically connected to a metal line through conductive vias 536 and further coupled to a shared hybrid bonding pad 702, while the top electrodes 512 are electrically coupled to TSVs 706 in a one-to-one mapping. Thus, the number of hybrid bonding pads and the number of control transistors needed are reduced.

By forming transistors and other FEOL structures in one wafer and data-storage elements in memory cells in another wafer, excessive thermal temperature can be applied to the ferroelectric films to improve crystallization without causing damage to the transistors and other FEOL structures. After the thermal treatment, the two wafers are bonded together by using a wafer-on-wafer technique. By forming data-storage elements in deep trenches, volumes needed for memory cells are reduced and layout density is increased. By sharing multiple data-storage elements with a hybrid bonding pad and a control transistor, the amount of hybrid bonding pads and control transistors needed is also significantly reduced, making wafer-on-wafer memory structure even more feasible.

In one exemplary aspect, the present disclosure is directed to a method of forming a memory device. The method includes forming a trench in a first substrate of a first wafer, depositing a data-storage element in the trench, performing a thermal treatment to the first wafer to improve a crystallization in the data-storage element, forming a first redistribution layer over the first substrate, forming a transistor in a second substrate of a second wafer, forming a second redistribution layer over the second substrate, and after the performing of the thermal treatment, bonding the first wafer with the second wafer, such that the data-storage element is electrically coupled to the transistor through the first and second redistribution layers. In some embodiments, the data-storage element includes a ferroelectric tunnel junction (FTJ). In some embodiments, the performing of the thermal treatment is prior to the forming of the first redistribution layer. In some embodiments, the depositing of the data-storage element includes depositing a bottom electrode layer in the trench, depositing a ferroelectric film over the bottom electrode layer, depositing a top electrode layer over the ferroelectric film, and patterning the bottom electrode layer, the ferroelectric film, and the top electrode layer to form the data-storage element. In some embodiments, the performing of the thermal treatment is prior to the patterning of the bottom electrode layer, the ferroelectric film, and the top electrode layer. In some embodiments, the thermal treatment includes applying a temperature above about 550° C. to the first wafer. In some embodiments, after the bonding of the first wafer with the second wafer, a thickness of the first wafer is less than a thickness of the second wafer. In some embodiments, the thickness of the first wafer is less than about 10 um, and the thickness of the second wafer is less than about 700 um. In some embodiments, the data-storage element includes a bottom electrode proximal to sidewalls of the trench and a top electrode distal to the sidewalls of the trench, and wherein the bottom electrode is in electrical coupling with the transistor. In some embodiments, the data-storage element includes a bottom electrode proximal to sidewalls of the trench and a top electrode distal to the sidewalls of the trench, and the top electrode is in electrical coupling with the transistor.

In another exemplary aspect, the present disclosure is directed to a method of forming a memory device. The method includes forming a plurality of ferroelectric tunnel junctions (FTJs) in a first wafer, performing a thermal treatment to improve a crystallization of a ferroelectric film in the FTJs, forming a first redistribution layer on the first wafer, wherein the first redistribution layer includes a plurality of first bonding pads that are associated with the plurality of FTJs, forming a plurality of transistors in a second wafer, forming a second redistribution layer on the second wafer, wherein the second redistribution layer includes a plurality of second bonding pads that are associated with the plurality of transistors, and after the performing of the thermal treatment, bonding the first wafer with the second wafer, such that the plurality of first bonding pads are bonded with the plurality of second bonding pads. In some embodiments, the ferroelectric film has a thickness less than about 5 nm. In some embodiments, the forming of the plurality of FTJs includes forming a plurality of trenches in the first wafer, depositing a bottom electrode layer in the plurality of trenches, depositing the ferroelectric film on the bottom electrode layer, depositing a top electrode layer on the ferroelectric film, and patterning the bottom electrode layer, the ferroelectric film, and the top electrode layer to form the plurality of FTJs. In some embodiments, the forming of the plurality of FTJs further includes after the depositing of the top electrode layer, depositing a plugging layer filling the trenches surrounded by the top electrode layer. In some embodiments, after the bonding of the first wafer with the second wafer, a pair of the bonded first and second bonding pads is associated with one and only one FTJ of the plurality of FTJs. In some embodiments, after the bonding of the first wafer with the second wafer, a pair of the bonded first and second bonding pads is associated with two or more FTJs of the plurality of FTJs.

In yet another exemplary aspect, the present disclosure is directed to a memory device. The memory device a first substrate including a plurality of transistors, a first distribution layer over the first substrate, the first distribution layer including a plurality of first bonding pads electrically coupled to the plurality of transistors, a second distribution layer over the first distribution layer, the second distribution layer including a plurality of second bonding pads in physical contact with the plurality of first bonding pads, and a second substrate over the second distribution layer, the second substrate including a plurality of data-storage elements embedded in the second substrate, each of the plurality of data-storage elements having a first electrode electrically coupled to one of the plurality of second bonding pads. In some embodiments, each of the plurality of data-storage elements has a second electrode electrically coupled to a bit line (BL) of the memory device. In some embodiments, each of the plurality of transistors has a gate structure electrically coupled to a word line (WL) of the memory device. In some embodiments, the data-storage elements include ferroelectric tunnel junctions (FTJs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory device, comprising:
   forming a trench in a first substrate of a first wafer;
   depositing a data-storage element in the trench;
   performing a thermal treatment to the first wafer to improve a crystallization in the data-storage element;
   forming a first redistribution layer over the first substrate, wherein the performing of the thermal treatment is prior to the forming of the first redistribution layer;
   forming a transistor in a second substrate of a second wafer;
   forming a second redistribution layer over the second substrate; and
   after the performing of the thermal treatment, bonding the first wafer with the second wafer, such that the data-storage element is electrically coupled to the transistor through the first and second redistribution layers.

2. The method of claim 1, wherein the data-storage element includes a ferroelectric tunnel junction (FTJ).

3. The method of claim 1, wherein the depositing of the data-storage element includes:
   depositing a bottom electrode layer in the trench;
   depositing a ferroelectric film over the bottom electrode layer;
   depositing a top electrode layer over the ferroelectric film; and
   patterning the bottom electrode layer, the ferroelectric film, and the top electrode layer to form the data-storage element.

4. The method of claim 3, wherein the performing of the thermal treatment is prior to the patterning of the bottom electrode layer, the ferroelectric film, and the top electrode layer.

5. The method of claim 1, wherein the thermal treatment includes applying a temperature above about 550° C. to the first wafer.

6. The method of claim 1, wherein after the bonding of the first wafer with the second wafer, a thickness of the first wafer is less than a thickness of the second wafer.

7. The method of claim 6, wherein the thickness of the first wafer is less than about 10 μm, and the thickness of the second wafer is less than about 700 um.

8. The method of claim 1, wherein the data-storage element includes a bottom electrode proximal to sidewalls of the trench and a top electrode distal to the sidewalls of the trench, and wherein the bottom electrode is in electrical coupling with the transistor.

9. The method of claim 1, wherein the data-storage element includes a bottom electrode proximal to sidewalls of the trench and a top electrode distal to the sidewalls of the trench, and wherein the top electrode is in electrical coupling with the transistor.

10. A method of forming a memory device, comprising:
forming a plurality of ferroelectric tunnel junctions (FTJs) in a first wafer;
performing a thermal treatment to improve a crystallization of a ferroelectric film in the FTJs;
forming a first redistribution layer on the first wafer, wherein the first redistribution layer includes a plurality of first bonding pads that are associated with the plurality of FTJs, wherein the first redistribution layer extends continuously from a sidewall of a first one of the first bonding pads to a sidewall of a second one of the first bonding pads;
forming a plurality of transistors in a second wafer;
forming a second redistribution layer on the second wafer, wherein the second redistribution layer includes a plurality of second bonding pads that are associated with the plurality of transistors; and
after the performing of the thermal treatment, bonding the first wafer with the second wafer, such that the plurality of first bonding pads are bonded with the plurality of second bonding pads.

11. The method of claim 10, wherein the ferroelectric film has a thickness less than about 5 nm.

12. The method of claim 10, wherein the forming of the plurality of FTJs includes:
forming a plurality of trenches in the first wafer;
depositing a bottom electrode layer in the plurality of trenches;
depositing the ferroelectric film on the bottom electrode layer;
depositing a top electrode layer on the ferroelectric film; and
patterning the bottom electrode layer, the ferroelectric film, and the top electrode layer to form the plurality of FTJs.

13. The method of claim 12, wherein the forming of the plurality of FTJs further includes:

after the depositing of the top electrode layer, depositing a plugging layer filling the trenches surrounded by the top electrode layer.

14. The method of claim 10, wherein after the bonding of the first wafer with the second wafer, a pair of the bonded first and second bonding pads is associated with one and only one FTJ of the plurality of FTJs.

15. The method of claim 10, wherein after the bonding of the first wafer with the second wafer, a pair of the bonded first and second bonding pads is associated with two or more FTJs of the plurality of FTJs.

16. The method of claim 10, wherein the performing of the thermal treatment is prior to the forming of the first redistribution layer.

17. A method, comprising:
forming a plurality of data-storage elements in a first substrate;
forming a first distribution layer over the first substrate, the first distribution layer including a plurality of first bonding pads, wherein the first distribution layer extends continuously between opposing sidewalls of adjacent ones of the plurality of first bonding pads, each of the plurality of data-storage elements having a first electrode electrically coupled to a respective one of the plurality of first bonding pads;
performing an annealing process to the plurality of data-storage elements;
forming a plurality of transistors in a second substrate;
forming a second distribution layer over the second substrate, the second distribution layer including a plurality of second bonding pads electrically coupled to the plurality of transistors;
after the performing of the annealing process, bonding the first wafer with the second wafer, such that the plurality of first bonding pads are bonded with the plurality of second bonding pads.

18. The method of claim 17, wherein the plurality of data-storage elements include ferroelectric tunnel junctions (FTJs).

19. The method of claim 18, wherein the annealing process improves a crystallization of a ferroelectric film in the FTJs.

20. The method of claim 17, wherein the annealing process increases a temperate above about 550° C. to the plurality of data-storage elements.

* * * * *